US012224375B2

(12) United States Patent
Kim et al.

(10) Patent No.: US 12,224,375 B2
(45) Date of Patent: Feb. 11, 2025

(54) LIGHT EMITTING DIODE WITH IMPROVED COLOUR PURITY

(71) Applicant: PLESSEY SEMICONDUCTORS LIMITED, Plymouth (GB)

(72) Inventors: Jun-Youn Kim, Plymouth (GB); Samir Mezouari, Plymouth (GB); John A. Shannon, Plymouth (GB); Kevin Stribley, Plymouth (GB); Mohsin Aziz, Plymouth (GB)

(73) Assignee: Plessey Semiconductors Limited, Plymouth (GB)

( * ) Notice: Subject to any disclaimer, the term of this patent is extended or adjusted under 35 U.S.C. 154(b) by 449 days.

(21) Appl. No.: 17/631,027

(22) PCT Filed: Jul. 24, 2020

(86) PCT No.: PCT/EP2020/071005
§ 371 (c)(1),
(2) Date: Jan. 28, 2022

(87) PCT Pub. No.: WO2021/018784
PCT Pub. Date: Feb. 4, 2021

(65) Prior Publication Data
US 2022/0271193 A1    Aug. 25, 2022

(30) Foreign Application Priority Data

Aug. 1, 2019 (GB) ..................................... 1911008

(51) Int. Cl.
*H01L 33/06* (2010.01)
*H01L 33/10* (2010.01)
(Continued)

(52) U.S. Cl.
CPC .............. *H01L 33/06* (2013.01); *H01L 33/10* (2013.01); *H01L 33/46* (2013.01); *H01L 33/52* (2013.01); *H01L 33/58* (2013.01)

(58) Field of Classification Search
CPC ......... H01L 33/06; H01L 33/10; H01L 33/46; H01L 33/52; H01L 33/58; H01L 33/32;
(Continued)

(56) References Cited

U.S. PATENT DOCUMENTS 6,259,719 B1    7/2001  Cunningham et al.
2002/0180351 A1  12/2002  McNulty et al.
(Continued)

FOREIGN PATENT DOCUMENTS

EP    2560217 A2    2/2013
EP    2999014 A1    3/2016
(Continued)

OTHER PUBLICATIONS

Great Britain Search Report, Application No. GB1911008.9, dated Jan. 27, 2020, 4 pages.
(Continued)

*Primary Examiner* — Jonathan Han
(74) *Attorney, Agent, or Firm* — Stinson LLP

(57) ABSTRACT

A light emitting diode is provided having a LED layer configured to emit pump light having a pump light wavelength from a light emitting surface, the LED layer comprising a plurality of Group III-nitride layers. A container layer is provided on the light emitting surface of the LED layer, the container surface including an opening defining a container volume through the container layer to the light emitting surface of the LED layer. A colour converting layer is provided in the container volume, the colour converting Got layer configured to absorb pump light and emit converted light of a converted light wavelength longer than the
(Continued)

pump light wavelength. A lens is provided on the container surface over the opening, the lens having a convex surface on an opposite side of the lens to the colour converting layer. A pump light reflector laminate provided over the convex surface of the lens the pump light reflector laminate having a stop-band configured to reflect the pump light centred on a first wavelength.

25 Claims, 11 Drawing Sheets

(51) Int. Cl.
  *H01L 33/46* (2010.01)
  *H01L 33/52* (2010.01)
  *H01L 33/58* (2010.01)
(58) Field of Classification Search
  CPC ... H01L 33/50; H01L 33/507; H01L 25/0753; H01L 33/60; H01L 25/075; H01L 33/30; H01L 25/13
  See application file for complete search history.

(56) References Cited

U.S. PATENT DOCUMENTS

| | | |
|---|---|---|
| 2004/0252509 A1 | 12/2004 | Lin |
| 2010/0051996 A1* | 3/2010 | Hsu .................. H01L 33/507 257/98 |
| 2010/0308354 A1 | 12/2010 | David et al. |
| 2013/0087821 A1* | 4/2013 | Do .................. H01L 33/507 257/98 |
| 2013/0270587 A1 | 10/2013 | Ouderkirk et al. |
| 2015/0108491 A1 | 4/2015 | Lu |
| 2017/0114979 A1 | 4/2017 | Kang et al. |
| 2017/0324011 A1* | 11/2017 | Hwang .................. H01L 33/58 |
| 2019/0157519 A1 | 5/2019 | Jung et al. |

FOREIGN PATENT DOCUMENTS

| | | |
|---|---|---|
| KR | 20120013548 A | 2/2012 |
| WO | 02/089175 A1 | 11/2002 |
| WO | 2005015647 A1 | 2/2005 |

OTHER PUBLICATIONS

Taiwanese Search Report, Application No. 109123170, dated Mar. 12, 2021, 1 page.
International Search Report, PCT/EP2020/071005, dated Sep. 29, 2020, 4 pages.
Written Opinion, PCT/EP2020/071005, dated Sep. 29, 2020, 7 pages.

* cited by examiner

LIGHT EMITTING DIODE WITH IMPROVED COLOUR PURITY

REFERENCE TO RELATED APPLICATIONS

This application is the 371 U.S. national stage application of International Patent Application No. PCT/EP2020/071005, filed Jul. 24, 2020, which claims the benefit of Great Britain Patent Application No. 1911008.9, filed Aug. 1, 2019, the entire disclosures of which are incorporated herein by reference.

FIELD OF THE DISCLOSURE

This disclosure relates to Light Emitting Diodes (LEDs) and LED arrays. In particular, this disclosure relates to LEDs comprising Group III-nitrides.

BACKGROUND

Micro LED arrays are commonly defined as arrays of LEDs with a size of 100×100 μm2 or less. Micro LED arrays are a self-emitting micro-display/projector which are suitable for use in a variety of devices such as smartwatches, head-wearing displays, head-up displays, camcorders, viewfinders, multisite excitation sources, and pico-projectors.

One known form of a micro-LED array comprises a plurality of LEDs formed from Group III-nitrides. Group III-nitride LEDs are inorganic semiconductor LEDs containing GaN and its alloys with InN and AlN in the active light-emitting region. Group III-nitride LEDs can be driven at significantly higher current density and emit a higher optical power density than conventional large-area LEDs, for example organic light emitting diodes (OLED) in which the light-emitting layer is an organic compound. As a result, higher luminance (brightness), defined as the amount of light emitted per unit area of the light source in a given direction, makes micro LEDs suitable for applications requiring or benefiting from, high brightness. For example, applications which benefit from high brightness may include displays in high brightness environments or projectors. Additionally, Group III-nitride micro LEDs are known to have relatively high luminous efficacy, expressed in lumens per watt (lm/W) compared to other conventional large area LEDs. The relatively high luminous efficacy of III-nitride micro LED arrays reduces power usage compared with other light sources and makes micro LEDs particularly suitable for portable devices.

In many applications it is desirable to provide a micro-LED array capable of outputting light having a range of wavelengths (i.e. a colour display/projector). For example, in many colour displays it is desirable to provide a micro-LED array with having plurality of pixels on a common substrate, wherein each pixel may output a combination of, for example, red, green, and blue light.

In general, there are two main approaches to the provision of LED colour displays comprising a plurality of pixels each capable of outputting a range of different colours. One approach seeks to provide each pixel of an array with a plurality of LEDs, with each LED arrange to emit light of a different wavelength.

An alternative approach is to provide each pixel of an array with one or more colour converting materials, such as phosphors or quantum dots. Such colour converting materials can convert light of a higher energy (pump light) into light of a lower energy (converted light) in order to provide the desired colours of the sub-pixels.

One problem with using colour converting materials is that it is challenging to efficiently convert light from the pump light wavelength to the converted light wavelength, and then extract the converted light only, from the device. One factor which reduces the efficiency of extracting converted light is that the colour converting material (e.g. quantum dots) may also absorb the converted light.

Furthermore, when using colour converting materials, it is desirable that the LED only outputs converted light, and not the pump light. If pump light leaks from the LED, the colour purity of the LED is reduced. Colour purity of an LED is an important parameter for an LED in many applications, for example displays.

One option to reduce pump light leakage is to use a distributed Bragg Reflector to reflect the pump light. In "Optical cross-talk reduction in a quantum dot-based full-colour micro-light-emitting-diode display by a lithographic-fabricated photoresist mold", Photonics Research, Vol. 5, No. 5, October 2017, a UV micro-LED array is used as an efficient excitation source for Quantum Dots (QD). To reduce optical cross-talk between sub-pixels, a simple lithography method and photoresist are used to fabricate a mould, which consists of an opening for the addition of QDs and a blocking wall for cross-talk reduction. A Distributed Bragg Reflector (DBR) is provided over the QDs to reflect the UV light passing through the QDs, thereby increasing the light emission of the QDs. The DBR also acts to increase the colour purity of the LED by preventing pump light from passing through the LED.

To further reduce the pump light leakage, the portion of the LED in which the colour converting material is provided may be lined with a material configured to absorb pump light. In "Monolithic Red/Green/Blue Micro-LEDs with HBR and DBR structures" Guan-Syun Chen, et. al, IEEE Photonics Technology Letters, Vol. 30, No. 3, 1 Feb. 2018, a black matrix photoresist with light blocking capability is spun onto micro-LEDs. The black matrix photoresist can block blue light emitted from the side of a blue micro-LED including red or green quantum dots. Thus, blue light cross talk between adjacent LEDs is reduced by the black matrix photoresist. However, the conversion efficiency is considerably reduced because all visible light that is incident on the inside-walls of each sub-pixel is absorbed.

Accordingly, there is a need to further improve the colour purity and also the efficiency of LEDs comprising colour converting materials.

It is an object of the present invention to provide an improved LED which tackles at least one of the problems associated with prior art LEDs or, at least, provide a commercially useful alternative thereto.

SUMMARY

The present inventors have realised that it is desirable to improve the colour efficiency and block crosstalk between each pixel whilst also enhancing the purity of LEDs comprising colour converting materials. Factors which influence the colour purity and efficiency of such LEDs include pump light leakage from the LED, the efficiency of the colour converting material in converting the pump light, and the efficiency of the LED in extracting the converted light.

The present inventors have realised that conventional DBRs, such as the DBR disclosed in "Optical cross-talk reduction in a quantum dot-based full-colour micro-light-emitting-diode display by a lithographic-fabricated photoresist mold" have a number of distinct drawbacks when applied to LEDs with colour converting materials. FIG. 1a shows a schematic diagram of the reflectivity of a convention DBR at a range of different incident angles. It will be appreciated that although the reflectivity of the DBR in the passband regions (i.e. either side of the stop-band) is less than the reflectivity in the stop-band, the reflectivity is still nevertheless significant.

As shown in FIG. 1a, varying the angle of incidence for the DBR shifts the peak wavelength for the harmonic peaks of reflectance in the passband. Varying the angle of incidence (with respect to the normal) between 0° and 30° as shown in FIG. 1a shifts the harmonic peaks across a substantial proportion of the visible light waveband.

The converted light output by a colour converting material (e.g. a quantum dot) is output in all directions from the colour converting material. Thus, for the LEDs incorporating DBRs a significant proportion of the converted light incident on the DBR will have a non-zero angle of incidence. This presents challenges for the design of a reflector having low reflectance at the converted light wavelength (e.g. green or red light) but high reflectance at the pump light wavelength (e.g. blue light).

In accordance with a first aspect of the invention, a LED is provided. The LED comprises a LED layer, a container layer, a colour converting layer, a lens, and a pump light reflector laminate. The LED layer is configured to emit pump light having a pump light wavelength from a light emitting surface, the LED layer comprising a plurality of Group III-nitride layers. The container layer is provided on the light emitting surface of the LED layer. The container layer has a container surface on an opposite side of the container layer to the light emitting surface, the container surface including an opening defining a container volume through the container layer to the light emitting surface of the LED layer. The colour converting layer is provided in the container volume, the colour converting layer configured to absorb pump light and emit converted light of a converted light wavelength longer than the pump light wavelength. The lens is provided on the container surface over the opening. The lens has a convex surface on an opposite side of the lens to the colour converting layer. The pump light reflector laminate is provided over the convex surface of the lens. The pump light reflector laminate has a stop-band configured to reflect the pump light. The stop-band is centred on a first wavelength. The pump light reflector laminate comprises:

(i) a first interface layer provided on the convex surface of the lens; the first interface layer having a first thickness and a first refractive index, wherein a product of the first refractive index and first thickness is one eighth of the first wavelength;

(ii) a plurality of layers alternating between a low reflectance layer having a second refractive index and a second thickness, wherein the second refractive index is lower than the first refractive index; and a high reflectance layer having a third thickness and a third refractive index which is higher than the second refractive index, wherein a product of the second refractive index and the second thickness for each of the low reflectance layers is one quarter of the first wavelength, and a product of the third refractive index and the third thickness for each of the high reflectance layers is one quarter of the first wavelength; and (iii) a second interface layer provided on a low reflectance layer of the plurality of layers, the second interface layer having a fourth refractive index and a fourth thickness, wherein a product of the fourth refractive index and the fourth thickness is one eighth of the first wavelength.

The pump light reflector laminate according to the first aspect is configured to have a high reflectance for light of the pump light wavelength generated by the LED layer. The reflector laminate is also configured to have a low reflectance for light of the converted light wavelength output by the colour converting materials. As such, the pump light reflector laminate is effectively a band-stop filter for light having a wavelength of about the pump light wavelength, and will transmit converted light. By contrast to DBRs known in the art, the reflectance of the pump light reflector laminate has suppressed harmonic peaks in its upper passband. Therefore, a lower proportion of converted light output by the colour converting material will be reflected by the pump light reflector laminate compared to a DBR.

Furthermore, the reflectance of the pump light reflector laminate in the upper passband is significantly less sensitive to variations in the angle of incidence of the light. For example, the pump light reflector laminate according to the first aspect may have a reflectance which remains relatively low (for example less than 10%) for converted light incident on the pump light reflector laminate with an angle of incidence from 0° up to and beyond 30°. Thus, the pump light reflector laminate will reflect a lower proportion of converted light having a range of different angle of incidences compared to a conventional DBR.

The present inventors have also realised that a further problem associated with providing a LED with a reflector is that light which is incident on the reflector at an angle of incidence in excess of 45° will be totally internally reflected at the interface between the reflector and the LED. As noted above, colour converting materials generally absorb a proportion of the converted light. Thus, internal reflection of the converted light not only reduces the proportion of converted light exiting the LED, but also increases the proportion of converted light absorbed by the colour converting material. Both of these mechanisms reduce the efficiency of the LED to output converted light.

The LED according to the first aspect aims to further increase the efficiency of the LED to output converted light by providing the pump light reflector laminate on a convex surface of a lens. As the pump light reflector laminate is provided on a convex surface, the proportion of converted light incident on the pump light reflector laminate with an angle of incidence over 45° is reduced, relative to providing the pump light reflector laminate on a planar surface. Accordingly, a greater proportion of the converted light will be transmitted through the pump light reflector laminate rather than internally reflected.

The pump light reflector laminate is, effectively, a band-stop filter. As such, the pump-light reflector laminate has a stop-band over a range of wavelengths from a lower stop-band wavelength to an upper stop-band wavelength in which substantially all light is reflected by the pump light reflector laminate. The stop-band is centred on a central wavelength (e.g. a first wavelength) such that the upper stop-band wavelength and the lower stop-band wavelength are equidistant from the central wavelength. The stop-band of the pump light reflector laminate is configured such that the pump light wavelength falls within the stop band, thereby ensuring that the pump light is reflected by the pump light reflector laminate. It will be appreciated by the skilled person that the central wavelength (first wavelength) of the stop-band may be different to the pump light wavelength.

That is to say, the stop-band may not be centred on the pump light wavelength, although in some embodiments, this may be the case.

In some embodiments, the container layer comprises an inner sidewall defining the container volume, wherein the inner sidewall defining the container volume is sloped at an acute angle relative to the light emitting surface of the LED layer and comprises a reflective material. By providing the container layer with reflective sidewalls, a greater proportion of light which is incident on the sidewalls will be reflected back into the container volume (relative to light absorbent sidewalls). Thus, a greater proportion of converted light, which may be generated in all directions from the colour converting material, may be extracted from the LED. Further, the sidewalls are sloped such that a greater proportion of the light is reflected towards the pump light reflector laminate. By providing sloped, reflective sidewalls, the proportion of converted incident on the pump light reflector laminate will increase, with the converted light being incident at a variety of angles of incidence. As discussed above, the reflectance of the pump light reflector laminate in the upper passband is significantly less sensitive to variations in the angle of incidence of the light. Thus, a synergistic effect between the sloped, reflective sidewalls and the pump light reflector laminate may be present which increase the extraction efficiency of converted light from the LED.

In some embodiments, the LED further comprises a reflection enhancement layer provided on the inner sidewall of the container layer, the reflection enhancement layer comprising a dielectric. For example, the reflection enhancement layer may comprise $SiO_2$.

In some embodiments, the LED further comprises an antireflection layer provided over the pump light reflector laminate, the antireflection layer configured to reduce reflection of light of the converted light wavelength. In some embodiments, the antireflection layer comprises a material having a refractive index less than a refractive index of the second interface layer of the pump light reflector laminate. In some embodiments, the antireflection layer has a thickness of one quarter of the first wavelength. The antireflection layer is provided in order to increase the converted light extraction efficiency of the LED.

In some embodiments, a converted light reflector laminate may be provided between the LED layer and the colour converting layer. The converted light reflector laminate has a stop-band configured to reflect the converted light centred on a second wavelength comprising:
(a) a third interface layer provided on the light emitting surface of the LED layer; the third interface layer having a fifth thickness and a fifth refractive index, wherein a product of the fifth thickness and fifth refractive index is one eighth of the second wavelength;
(b) a plurality of layers alternating between:
a converted light high reflectance layer having a sixth thickness and a sixth refractive index which is higher than the fifth refractive index, a converted light low reflectance layer having a seventh refractive index and a seventh thickness, wherein the seventh refractive index is lower than the sixth refractive index; and
wherein a product of the sixth refractive index and the sixth thickness for each of the converted light high reflectance layers is one quarter of the second wavelength, and a product of the seventh refractive index and the seventh thickness for each of the converted light low reflectance layers is one quarter of the second wavelength; and
(c) a fourth interface layer provided on a converted light high reflectance layer of the plurality of layers, the fourth interface layer having an eighth refractive index and an eighth thickness, wherein a product of the eighth refractive index and the eighth thickness is one eighth of the second wavelength, and the eighth refractive index is lower than the sixth refractive index.

With reference to the pump light reflector laminate discussed above, the converted light reflector laminate is effectively a band-stop filter configured to reflect converted light, but transmit pump light. The converted light reflector laminate is provided to increase the proportion of converted light which is directed to the opening of the container layer (i.e. to the pump light reflector laminate) in order to increase the converted light extraction efficiency of the LED.

In some embodiments, a lens interface layer is provided on the pump light reflector laminate on an opposite side to the lens. The lens interface layer may have a further convex surface on an opposite side to the pump light reflector layer, i.e. the lens interface layer may define a further lens shape on top of the lens and pump light reflector. The lens interface layer may be considered in combination with the lens as a lens super-structure. As such, the pump light reflector laminate may be considered to be provided within a lens super structure. In some embodiments, the antireflection layer may be provided over the pump light reflector layer on the further convex surface of the lens interface layer.

In some embodiments, the colour converting layer comprises quantum dots and/or a phosphor. In some embodiments, at least: 50%, 60%, 70%, 80% or 90% by volume of the container volume may be filled by the colour converting layer. In some embodiments, the colour converting layer is provided substantially in a central region of the container volume.

In some embodiments, the inner sidewall forms an angle relative to the light emitting surface of the LED layer of at least 30°. Accordingly, the slope of the inner sidewall may be provided to increase the proportion of converted light reflected to the opening of the container volume. In some embodiments the inner sidewall forms an angle relative to the light emitting surface of the LED layer of no greater than 85°. Accordingly, the slope of the inner sidewall may be provided such that a substantial proportion of the opening of the container layer is aligned with the light emitting surface of the LED layer. In some embodiments, the pump light wavelength may be at least 440 nm and/or no greater than 480 nm; and/or the converted light wavelength may be at least 500 nm and/or no greater than 650 nm. Accordingly, the LED according to the first aspect may be configured to convert blue pump light to a different colour light. For example the LED may output red or green converted light.

In some embodiments, the container layer defines an opening having a surface area of no greater than $10^{-8}$ m$^2$. In some embodiments, the container layer may define an opening having area dimensions of less than 100 μm×100 μm. As such, the LED according to the first aspect may be a micro-LED.

In some embodiments, the pump light reflector and/or the converted light reflector may comprise layers of $TiO_2$ and $SiO_2$. Accordingly, the pump light reflector and/or the converted light reflector may be fabricated using thin film deposition methods commonly used in the fabrication of thin film electronic devices, such as displays, micro-LED displays etc. In particular, the layers of the pump light reflector are configured to suppress harmonic reflections in the passband in the range of 510 nm to 550 nm (for green LEDs) and in the range 600 nm to 630 nm (for red LEDs).

In some embodiments, the first, third, and/or fourth refractive index is at least 2. In some embodiments, the second refractive index is no greater than 1.8.

In some embodiments, the first refractive index of the first interface layer, the third refractive index of the high reflectance layer, and the fourth refractive index of the second interface layer are the same. In some embodiments the fifth refractive index of the third interface layer, the seventh refractive index of the converted light low reflectance layer, and the eighth refractive index of the fourth interface layer are the same. As such, each of the pump light reflector laminate and the converted light reflector laminate may be provided by alternating layers of two different compositions.

In some embodiments, the first wavelength ($\lambda_0$), the second refractive index ($n_L$) and the third refractive index ($n_H$) of the pump light reflector laminate provide an upper stop-band wavelength ($\lambda_e$) of the pump light reflector laminate which is longer than the pump light wavelength, where:

$$\lambda_e = \frac{\lambda_0}{1 - \frac{2}{\pi}\sin^{-1}\left(\frac{(n_H - n_L)}{(n_H + n_L)}\right)}$$

According to a second aspect of the disclosure, a light emitting diode (LED) array is provided. The LED array comprises a LED layer, a container layer, a colour converting layer, a lens, and a pump light reflector. The LED layer comprises a plurality of LEDs, each LED configured to emit pump light of a pump light wavelength from a light emitting surface and each LED comprising a plurality of Group III-nitride layers. The container layer is provided on the light emitting surface of the LED layer. The container layer has a container surface on an opposite side of the container layer to the light emitting surface.

The container surface includes a plurality of openings each defining a container volume through the container layer to the light emitting surface of the LED layer, each opening and container volume aligned with a respective LED of the LED layer. The colour converting layer is selectively provided in a container volume, the colour converting layer configured to absorb pump light and emit converted light of a converted light wavelength longer than the pump light wavelength. The lens is provided on the container surface over the opening to the container volume containing a colour converting material, the lens having a convex surface on an opposite side of the lens to the colour converting layer. The pump light reflector laminate is provided over the convex surface of the lens. The pump light reflector laminate has a stop-band configured to reflect the pump light centred on a first wavelength.

The pump light reflector laminate comprises:
(1) a first interface layer provided on the convex surface of the lens; the first interface layer having a first thickness and a first refractive index, wherein a product of the first refractive index and first thickness is one eighth of the first wavelength;
(2) a plurality of layers alternating between:
 a low reflectance layer having a second refractive index and a second thickness, wherein the second refractive index is lower than the first refractive index; and
 a high reflectance layer having a third thickness and a third refractive index which is higher than the second refractive index,
 wherein a product of the second refractive index and the second thickness for each of the low reflectance layers is one quarter of the first wavelength, and a product of the third refractive index and the third thickness for each of the high reflectance layers is one quarter of the first wavelength;
(3) a second interface layer provided on a low reflectance layer of the plurality of layers, the second interface layer having a fourth refractive index and a fourth thickness, wherein a product of the fourth refractive index and the fourth thickness is one eighth of the first wavelength and the fourth refractive index is longer than the second refractive index.

Accordingly, a LED array including a plurality of LEDs may be provided. At least one of the LEDs in the array includes a colour converting layer covered by a lens with a pump light reflector, as described in the first aspect of the invention. Thus, the LED array according to the first aspect may output light having a range of different wavelengths (colours) through selective use of the LED with the colour converting layer, and/or LEDs not including the colour converting layer. As such, the LED array may output light having a pump light wavelength and/or a first converted light wavelength. Importantly, the LED array may output light of the first converted light wavelength with improved efficiency and colour purity for at least the reasons described above for the first aspect.

In some embodiments, a further colour converting layer is provided in a further container volume of the plurality of container volumes, the further colour converting layer configured to absorb pump light of the pump light wavelength and emit converted light of a second converted light wavelength longer than the first converted light wavelength. In some embodiments, a lens is provided over the further container volume, and a pump light reflector laminate is provided on the lens.

Accordingly, the LED array may include a plurality of LEDs with different colour converting layers provided in respective container volumes. For example, a first colour converting layer may be provided in a first container volume, and a second colour converting layer may be provided in a second container volume. The first and second colour converting layers may be configured to convert pump light to different wavelengths of converted light, for example green and red respectively. Thus, the LED array according to the second aspect may provide one or more pixels of a LED display, wherein each pixel includes LEDs which output red, green and blue light (blue light being pump light).

FIG. 1b shows an example of the DCI-P3 colour space standard. For display applications of the LED array, it is desirable to provide a plurality of LEDs in the LED array which comply with the DCI-P3 colour space standard. To comply with DCI-P3, the colour converting layer may, for example, comprise quantum dots. As such, a first colour converting layer may be configured to produce converted light with a wavelength of 532 nm and a second colour converting layer may be configured to produce converted light with a wavelength of 625 nm. The first and second colour converting materials may have a spectral width (Full Width Half Maximum) of 40 nm and 50 nm for the first and second colour converting materials respectively. The pump light (providing the blue colour subpixel) may have a peak wavelength of 455 nm with a spectral width of 20 nm.

In some embodiments, at least one converted light reflector laminate is provided between the colour converting layer and the light emitting surface of the corresponding LED of the LED layer. The converted light reflector laminate has a stop-band configured to reflect the first and/or second converted light centred on a second wavelength. The converted light reflector laminate comprises:

(x) a third interface layer provided on the light emitting surface of the LED layer; the third interface layer having a fifth thickness and a fifth refractive index, wherein a product of the fifth thickness and fifth refractive index is one eight of the second wavelength;

(y) a plurality of layers alternating between:
a converted light high reflectance layer having a sixth thickness and a sixth refractive index which is higher than the fifth refractive index,
a converted light low reflectance layer having a seventh refractive index and a seventh thickness, wherein the seventh refractive index is lower than the sixth refractive index; and
wherein a product of the sixth refractive index and the sixth thickness for each of the converted light high reflectance layers is one quarter of the second wavelength, and a product of the seventh refractive index and the seventh thickness for each of the converted light low reflectance layers is one quarter of the second wavelength;

(z) a fourth interface layer provided on a converted light high reflectance layer of the plurality of layers, the fourth interface layer having an eighth refractive index and an eighth thickness, wherein a product of the eighth refractive index and the eighth thickness is one eighth of the second wavelength, and the eighth refractive index is lower than the sixth refractive index.

In some embodiments, the container layer comprises a plurality of inner sidewalls defining the container volumes, wherein the inner sidewalls defining the container volumes are sloped at an acute angle relative to the light emitting surface of the LED layer and comprise a reflective material. Thus, the container volume for each LED of the LED array may be configured to increase the amount of light extracted from each LED.

It will be appreciated that optional features of the first aspect of the invention may also be applied to the second aspect of the invention, in particular to LEDs in the LED array incorporating a colour converting layer.

BRIEF DESCRIPTION OF THE FIGURES

The disclosure will now be described in relation to the following non-limiting figures. Further advantages of the disclosure are apparent by reference to the detailed description when considered in conjunction with the figures in which.

DETAILED DESCRIPTION

According to an embodiment of this disclosure a LED array 10 is provided. The LED array includes three LEDs, each LED configured to output a different wavelength of light. At least one of the LEDs includes a colour converting material. As such, the LED array 10 also includes an LED according to an embodiment of this disclosure.

Figure 2:
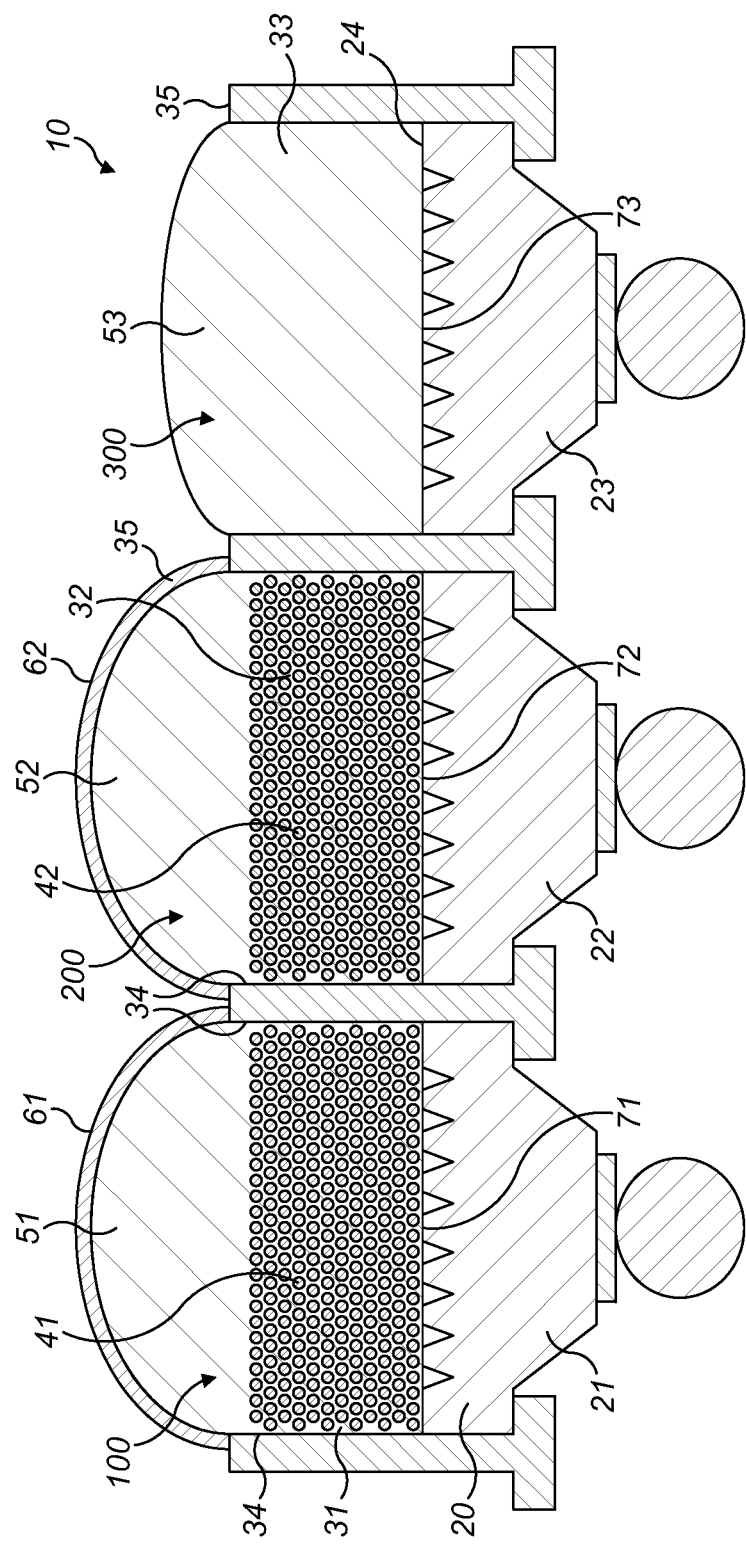
FIG. 2 is a diagram of a LED array according to an embodiment of this disclosure.

FIG. 2 is a diagram of a LED array 10 according to an embodiment of this disclosure. The LED array shown in FIG. 2 comprises a green LED 100, a red LED 200, and a blue LED 300.

The LED array 10 comprises a light generating layer 20. The light generating layer 20 includes an array of semiconductor junctions, wherein each semiconductor junction is configured to output pump light. As such, the light generating layer 20 may be considered to be an array of pump light LEDs 21, 22, 23. In the embodiment of FIG. 2, the array of pump light LEDs 21, 22, 23 each comprise Group III-nitrides. Each of the pump light LEDs 21, 22, 23 comprises an n-type semiconducting layer (not shown), an active layer including a plurality of quantum wells (not shown), and a p-type semiconducting layer (not shown). For example, the light generating layer 20 may be provided by monolithically forming an array of pump light LEDs on a substrate followed by removal of the substrate to expose a light emitting surface 24 of the light generating layer 20. The fabrication of a monolithic array of pump light LEDs 21, 22, 23 is further described in at least GB 181109.6.

Of course, in other embodiments, an array of pump light LEDs may be provided with transparent contacts, such that a light emitting surface 24 of a light generating layer 20 may be provided on an opposite side of the light emitting surface 24 to a substrate. That is to say, the light emitting surface 24 of the light generating layer 20 may be any major surface of the light generating layer 20.

The light generating layer 20 shown in FIG. 2 includes three pump light LEDs. Each of the pump light LEDs 21, 22, 23 is configured to output light having a pump light wavelength.

For example, in the embodiment of FIG. 2, the wavelength of the pump light may correspond to blue visible light. In some embodiments, the wavelength of the pump light may be at least 440 nm and/or no greater than 470 nm. In particular, the wavelength of the pump light may be at least 450 nm, and/or no greater than 460 nm. In this disclosure, where a LED is described as outputting light having a wavelength, said wavelength is considered to be the wavelength of light output by the LED having the highest intensity (peak intensity). As is known in the art, the wavelength of the pump light may be determined by the multiple quantum wells present in the active layer of the pump light LEDs 21, 22, 23.

As shown in FIG. 2, the LED array 10 includes a container layer 30. The container layer 30 is provided on the light emitting surface of the light generating layer 20. The container layer 30 includes a plurality of inner sidewalls 34 which define a plurality of container volumes 31, 32, 33 on the light emitting surface 24 of the light generating layer 20. Each container volume is provided though the container layer (i.e. through the thickness of the container layer 30). As such, each container volume 31, 32, 33 extends from an opening in a container surface 35 of the container layer through the light emitting surface 24.

Each container volume 31, 32, 33 is aligned with a pump light LED 21, 22, 23 of the light generating layer 20. The inner sidewalls 34 of the container layer may surround each of the pump light LEDs such that the container volumes 31, 32, 33 are generally aligned with the pump light LEDs. In some embodiments, the inner sidewalls 34 of the container layer 30 may be configured to align a centre of each container volume 31, 32, 33 with a centre of each pump light LED 21, 22, 23.

The container layer 30 includes a container surface 35. The container surface 35 is a surface of the container layer 30 which is provided on a side of the container layer 30 on an opposite side to the light generating layer 20. The container surface 35 defines a plurality of openings, one for each of the container volumes 31, 32, 33. As such, the openings of the container surface 35 are defined by the inner sidewalls 34 of the container layer 30.

Figure 5:
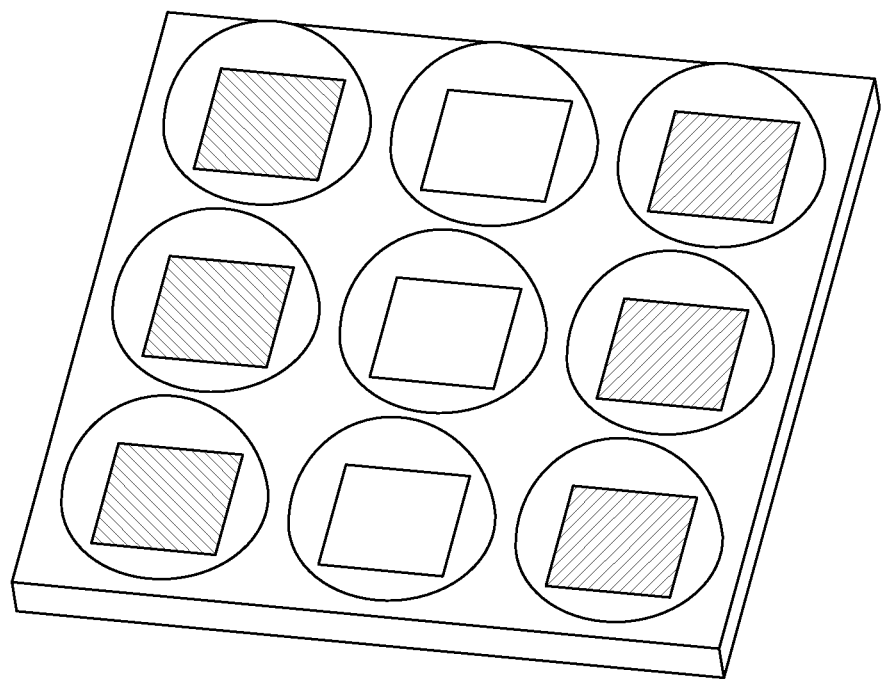
FIG. 5 is a diagram of a perspective view of an LED array comprising red, green and blue LEDs.

The openings of the container layer 30 may be provided in a variety of different shapes. For example, the openings may be elliptical, rectangular, hexagonal, or indeed any form of irregular or regular polygon. In some embodiments, the shape of the opening corresponds to a shape of the pump light LED, although in other embodiments the shape of the opening may be different to the shape (in plan view) of the pump light LED 21, 22, 23. Depending on the shape of the opening, each container volume 31, 32, 33 may be defined by one or more inner sidewall 34. For example, for an elliptical opening, a single continuous inner sidewall may define the container volume. FIG. 5 shows a diagram of a perspective view of an LED array according to an embodiment of the disclosure. In the embodiment of FIG. 5, each LED includes a container volume having a rectangular profile. The container surface 35 defines a plurality (nine) of openings, each of which have a rectangular (square) shape. For a rectangular opening, four inner sidewalls 34 may define the container volume, and so on.

Figure 3:
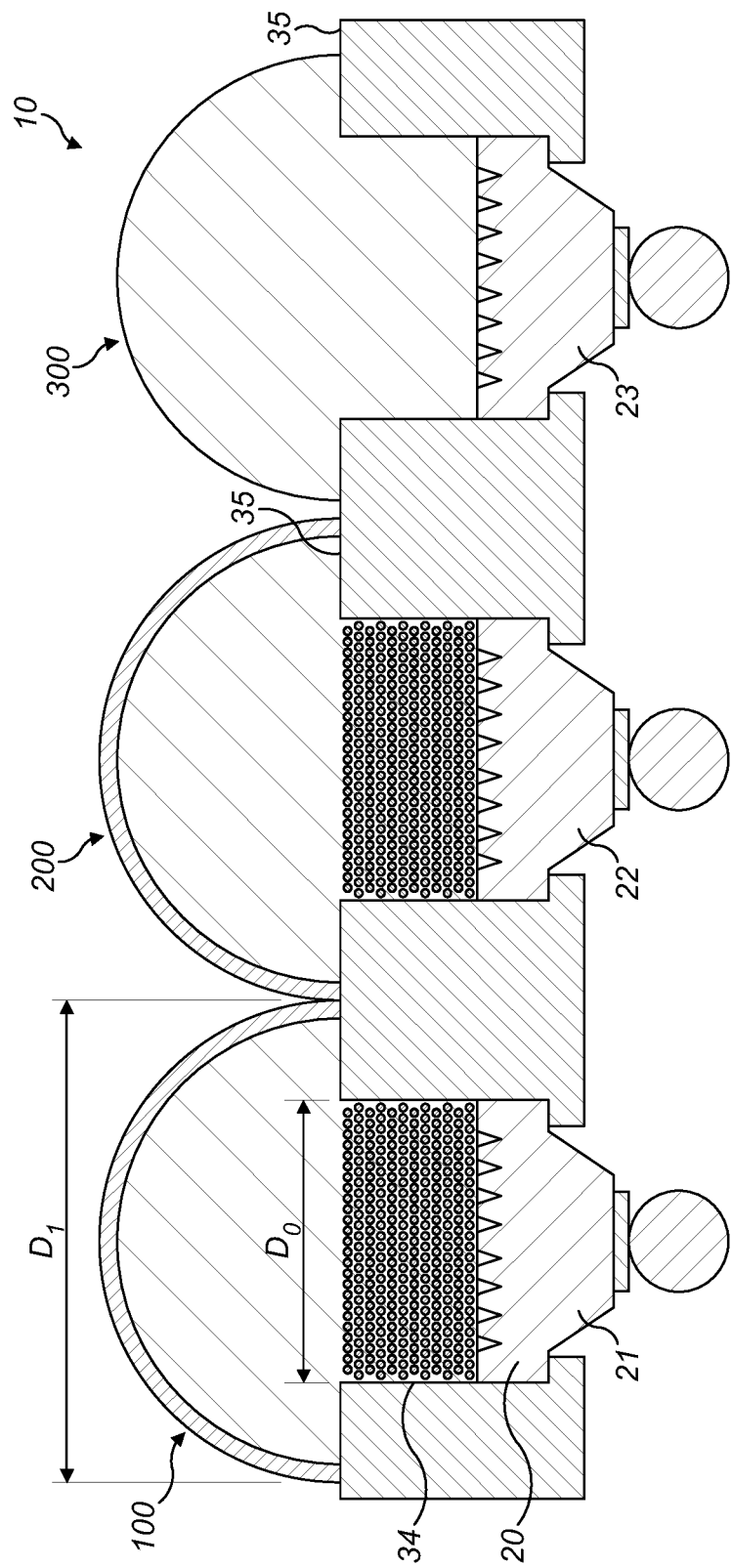
FIG. 3 is a diagram of a LED array according to a further embodiment of this disclosure.

FIG. 3 is a diagram of a LED array according to a further embodiment of this disclosure. The LED array shown in FIG. 3 comprises a green LED 100, a red LED 200, and a blue LED 300. In some embodiments, the opening of each LED on the container surface 35 has a characteristic dimension $D_0$. The characteristic dimension $D_0$ is the maximum diameter of the opening. For example, for a circular opening $D_0$ is the diameter of the opening. For a square opening, $D_0$ is the diagonal, corner-to-corner distance. In some embodiments, each lens has a characteristic dimension $D_1$ based on a diameter of the lens. For example, in FIG. 3 the lens has a hemispherical shape. The diameter of the hemispherical lens is the characteristic dimension $D_1$. In some embodiments, $0.1\ D_1 \leq D_0 \leq 0.8\ D_1$. In particular, the characteristic dimension of the opening $D_0$ may be about 50% of the characteristic dimension of the lens $D_1$ in order to efficiently extract light from the LED.

Figure 4B:
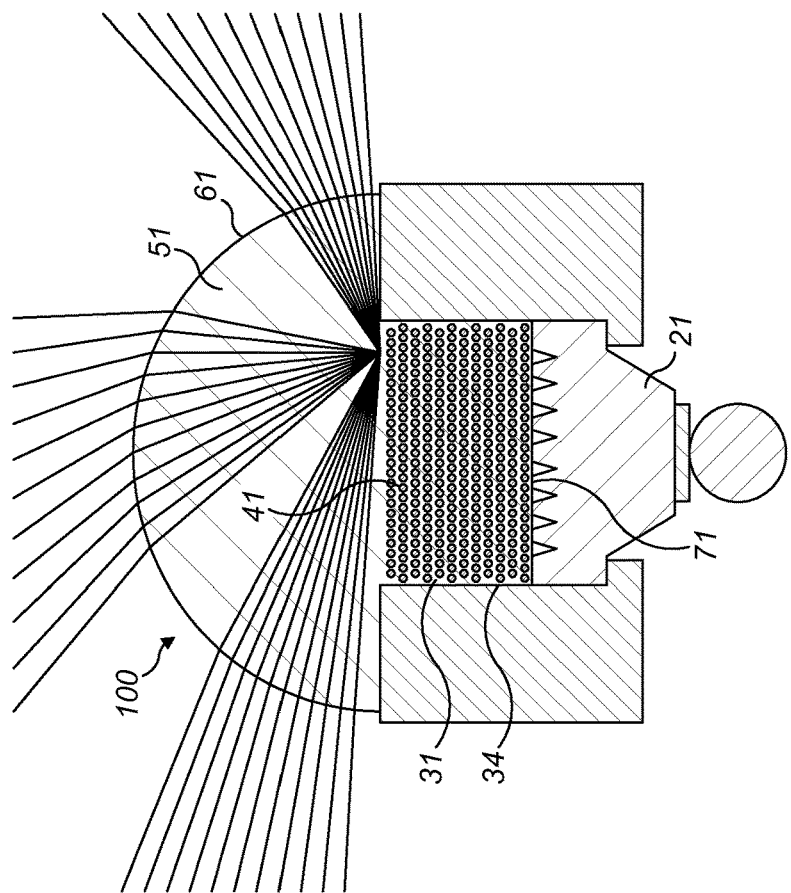
FIG. 4b is a ray-tracing diagram of a LED sub-pixel at the edge of the colour conversion area according to an embodiment of this disclosure.
Figure 4A:
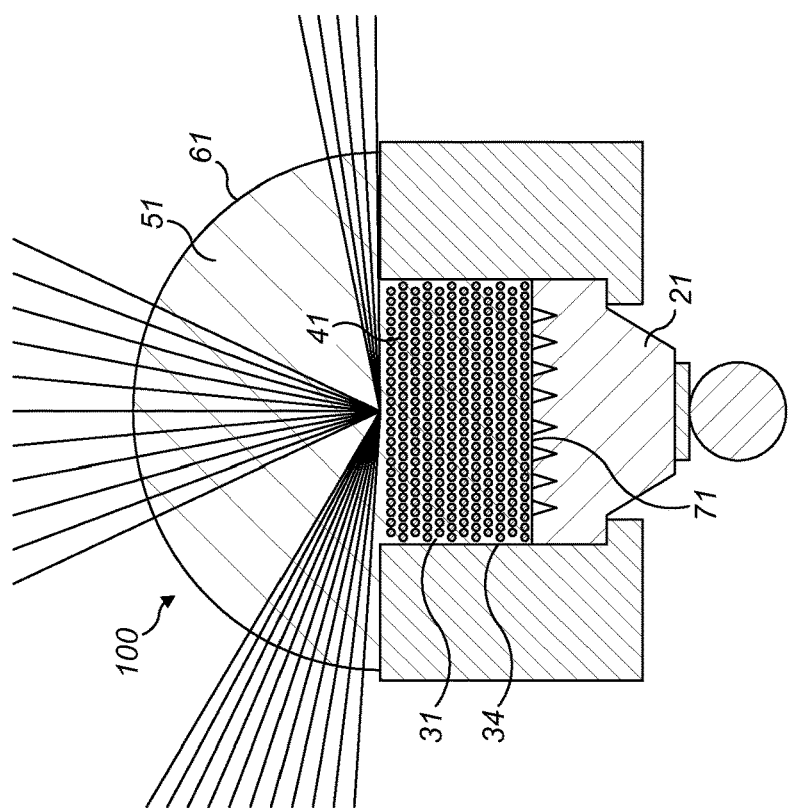
FIG. 4a is a ray-tracing diagram of a LED sub-pixel at the centre of the colour conversion area according to an embodiment of this disclosure.

FIGS. 4a and 4b show ray tracing diagrams for a LED of the LED array of FIG. 3 having a hemispherical lens. As illustrated in FIG. 4a, a ray tracing diagram of the emitted light from the centre of the opening of the container surface shows all emerging rays are of normal incidence to the interface of the lens. FIG. 4b further illustrates rays emitted from the edge of the opening of the container surface where all rays have an incidence angle with the lens interface smaller than 30°.

FIG. 5 shows a perspective view of a LED array comprising red, green and blue LEDs (i.e. a RGB array). The LED array comprises 9 LEDs, of which three LEDs are blue LEDs, three LEDs are red LEDs, and three LEDs are green LEDs. The LEDs are arranged as a square-packed array. In other embodiments, other arrangements, for example, hexagonally packed array may be provided.

Figure 6:
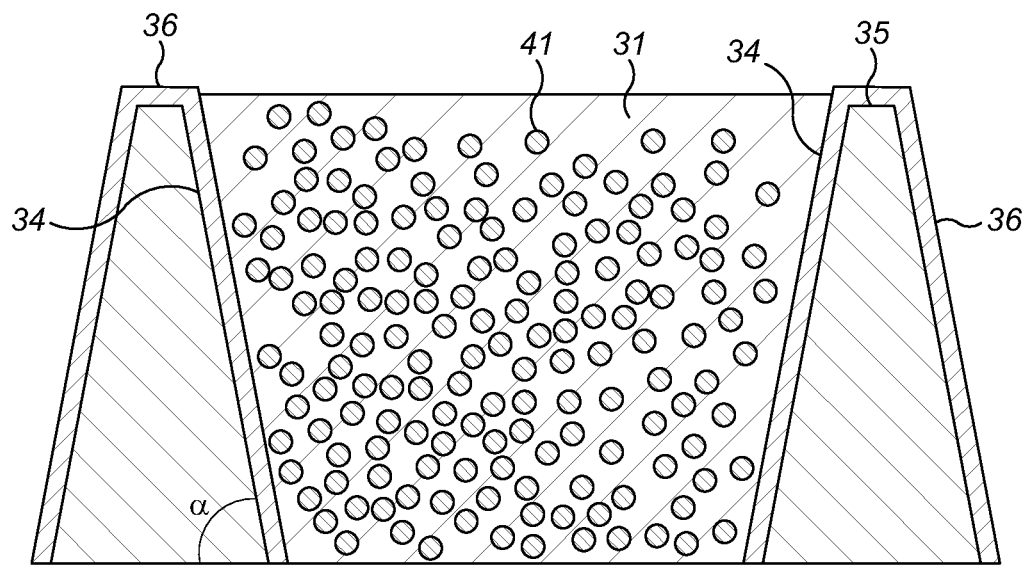
FIG. 6 is a diagram of a container layer of an LED according to an embodiment of this disclosure.

FIG. 6 shows a diagram of a portion of a container layer 30 of an LED according to an embodiment of this disclosure. As shown in FIG. 6, the inner sidewalls 34 of the container layer 30 are sloped with respect to the light generating layer 20 (i.e. the inner sidewalls 34 are not normal to the surface). As shown in FIG. 6, the inner sidewalls 34 are sloped at an acute angle between the light emitting surface 24 and the inner sidewall 34. As such, the inner sidewalls 34 may be sloped such that the opening of the container volume 31, 32, 33 in the container surface 35 has a larger surface area than the surface area of the container volume 31, 32, 33 at the interface with the light emitting surface 24.

In some embodiments, the sidewalls for each container volume 31, 32, 33 may be sloped at an angle α of at least 35°. By providing an angle of at least 35°, each container volume may have a surface area such that a pixel pitch of the LED array does not become excessive In some embodiments, the sidewalls for each container volume 31, 32, 33 may be sloped at an angle α of no greater than 85°. In the embodiment shown in FIG. 6, the inner sidewalls 34 are sloped at an angle α of 80°. In some embodiments, providing the inner sidewalls with an angle of no greater than 85°, or no greater than 60°, may increase the optical efficiency of the LED, as a greater proportion of converted light may be directed towards the opening of the container volume 31, 32, 33.

The container layer 30 may comprise a reflective material. The reflective material may be provided in order to form a container layer 30 with reflective inner sidewalls 34. As such, the reflective material may be provided as an outer layer of the container layer 30. By providing the container layer 30 with reflective inner sidewalls 34, a greater proportion of light which is incident on the sidewalls will be reflected back into the container volume (relative to light absorbent sidewalls). Thus, a greater proportion of converted light, which may be generated in all directions from the colour converting material, may be extracted from the LED. The reflective material may be a thin film metal, for example Al or Ag.

In some embodiments, for example as shown in FIG. 6, the LED further comprises a reflection enhancement layer 36 provided on the inner sidewall of the container layer 30, the reflection enhancement layer 36 comprising a dielectric. For example, the reflection enhancement layer 36 may comprise $SiO_2$. The reflection enhancement layer 36 may be provided on at least the inner sidewalls 34 of the container layer 30. The reflection enhancement layer 36 may have a thickness normal to the inner sidewalls 34 which is about one quarter (25%) of the converted light wavelength.

As shown in FIG. 2, at least one of the container volumes 31, 32 may selectively include a colour converting layer 41. In the embodiment of FIG. 2, a first (green) container volume 31 includes a first (green) colour converting layer 41. A second (red) container volume 32 includes a second (red) colour converting layer 42. Each colour converting layer is configured to convert pump light into converted light of a different wavelength. For example, the first colour converting layer 41 may be configured to convert pump light into green visible light, while the second colour converting 42 layer may be configured to convert pump light into red visible light. As such, colour converting layers may be configured to convert pump light having a wavelength of at least 440 nm and/or no greater than 480 nm. The first colour converting layer 41 may convert the pump light to converted light having a wavelength of at least 500 nm and/or no greater than 550 nm. The second colour converting layer 42 may convert pump light to converted light having a wavelength of at least 600 nm and/or no greater than 650 nm.

In some embodiments, the colour converting layers 41, 42 may comprise quantum dots. In some embodiments the colour converting layers 41, 42 may comprise phosphors. In some embodiments, the colour converting layers 41, 42 may comprise a combination of phosphors and quantum dots. For LEDs, and LED arrays having container volumes with a surface area in excess of 1 mm$^2$, the larger particle size of phosphors may be advantageous. For LEDs and LED arrays having container volumes with surface areas less than 1 mm$^2$, for example micro LEDs, it may be advantageous to use a colour converting layer comprising quantum dots, due to the smaller particle size. Colour converting materials, including quantum dots are known to the skilled person. Further details of suitable quantum dots for use as a colour converting layer may be found in at least "Monolithic Red/Green/Blue Micro-LEDs with HBR and DBR structures" Guan-Syun Chen, et. al.

As shown in FIG. 2, the colour converting layer 41, 42 may extend across the container volume 21, 22. The container volume 21, 22 is at least partially filled by the colour converting layer.

As shown in FIG. 2, at least one of the container volumes 33 of the LED array 10 may not include any colour converting layer. Thus, some LEDs in the LED array may output pump light through the unfilled container volume. For example, where the pump light is blue visible light, a container volume may not include a colour converting layer in order to provide a blue LED 300.

As shown in FIG. 2, a lens 51 is provided on the container surface 35 over the opening covering the first colour converting layer 41. The lens 51 has a convex surface on an opposite side of the lens to the first colour converting layer 41. The lens is provided in order to reduce the amount of converted light which is totally internally reflected at the interface between the LED and the outside environment.

The lens may comprise an optically transparent material. For example, the lens may comprise silicon, SiO$_2$, or other dielectric material. The lens can be fabricated using imprint lithography with, for instance a UV-curable hybrid polymers material such as Ormoclear (RTM) from "Micro Resist Technology GmbH". The lens can also be printed using a resin.

As shown in FIG. 2, a lens 51, 52, may be provided over each of the container volumes 31, 32 including a colour converting layer 41, 42. In some embodiments, a lens 51, 52, 53 may be provided over each container volume 31, 32, 33.

As shown in FIG. 2, the lenses for each type of LED 100, 200, 300 may have a convex surface with different radii of curvature. As shown in FIG. 2, the lens 53 for the blue LED 300 has a larger radii curvature than the red and green LEDs which include colour converting layers 41, 42. The radius of curvature for the blue LED 300 may be increased as the blue light LED 300 only output pump light from the light generating layer 20. As such, the pump light output by the blue LED may have a different distribution of light intensity with respect to angle of incidence compared to LEDs outputting converted light. For example, a larger proportion of pump light output by the blue LED 300 may travel in a direction normal to the light emitting surface 24, compared to converted light of the colour converting layers 41, 42. Accordingly, the radius of curvature for the lens 53 of container volumes not including a colour converting layer may be increased in order to further reduce total internal reflection of those LEDs.

In the embodiment of FIG. 3, the lenses 51, 52, 53 for each LED 100, 200, 300 are the same. As shown in FIG. 3, the radius of curvature for a lens 51, 52, 53 may be no greater than 2D$_0$ (i.e. double). In particular, the radius of curvature for a lens may be no greater than D$_0$.

A first pump light reflector laminate 61 is provided over the convex surface of the lens 51 for the green LED 100. A second pump light reflector laminate 62 is also provided over the convex surface of the lens 52 for the red LED 200. Thus, the first and second pump light reflector laminates may conform to the convex surface of the respective lens 51, 52. As such, the first and second pump light reflector laminates 61, 62 also have convex surfaces.

As the first and second pump light reflector laminates 61, 62 have convex surfaces, the amount of converted light incident on the pump light reflector laminates with an angle of incidence greater than 45° is reduced, relative to a flat surface. Accordingly, the proportion of converted light which may be totally internally reflected by the pump light reflector laminates 61, 62 may be reduced. As such, a greater proportion of the converted light may be transmitted through the pump light reflector laminates 61, 62, thereby increasing the extraction efficiency of the green and red LEDs 100, 200.

Figure 7:
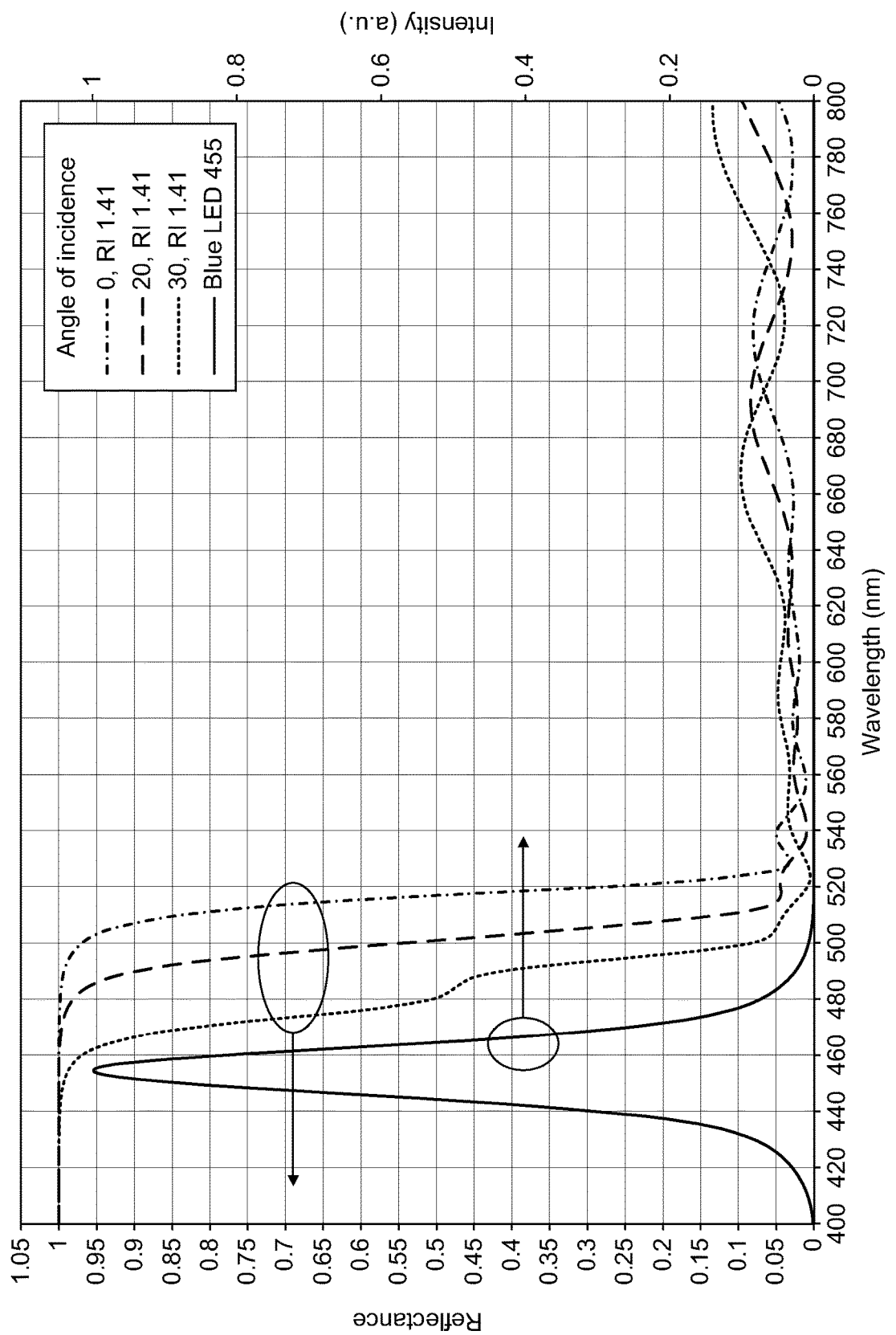
FIG. 7 is a graph of the reflectivity of a reflector laminate.

A graph showing the reflectance of a pump light reflector laminate 61, 62 is shown in FIG. 7. The pump light reflector laminate 61, 62 is, effectively, a band-stop filter. As such, the pump-light reflector laminate 61, 62 has a stop-band over a range of wavelengths from a lower stop-band wavelength to an upper stop-band wavelength ($\lambda_e$) in which substantially all light reflected by the pump light reflector laminate. The stop-band is centred on a central wavelength ($\lambda_0$) (e.g. a first wavelength) such that the upper stop-band wavelength ($\lambda_e$) and the lower stop-band wavelength are equidistant from the central wavelength. For wavelengths shorter than the lower stop-band wavelength, the pump light reflector laminate 61, 62 has a lower pass band, in which light is generally transmitted through the pump light reflector laminate. Similarly, for wavelengths longer than the upper stop-band wavelength ($\lambda_e$), the pump light reflector laminate 61, 62 has an upper pass band, in which light is generally transmitted through the pump light reflector laminate 61, 62.

Figure 8:
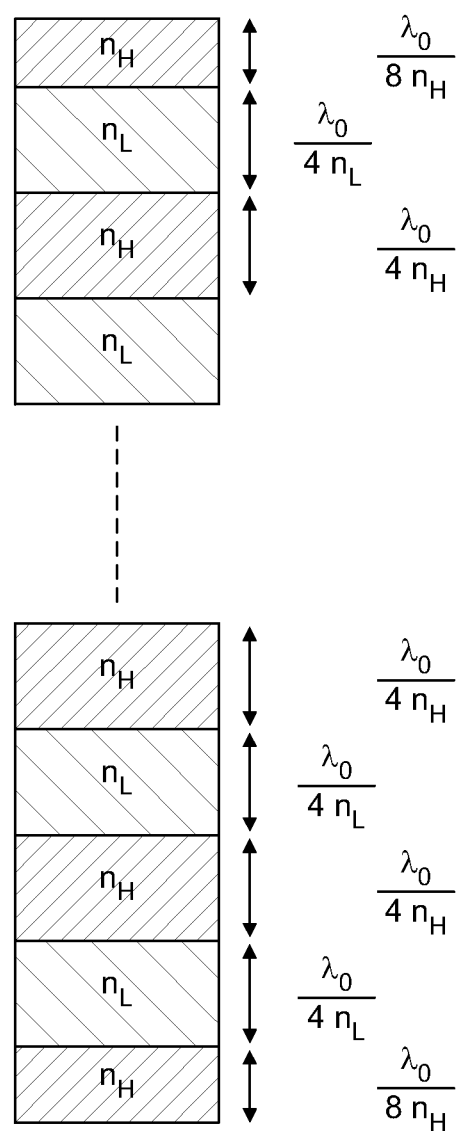
FIG. 8 is a diagram of a reflector laminate according to an embodiment of the disclosure.

A diagram of the pump light reflector laminate of FIG. 7 is shown in FIG. 8. The pump light reflector laminate 61 comprises a first interface layer, a plurality of alternating first and second reflector layers and a second interface layer.

The plurality of alternating first and second reflector layers form a central portion of the pump light reflector laminate 61. The first reflector layer (H) has a first refractive index ($n_H$), and the second reflector layer (L) has a second refractive index ($n_L$). The first refractive index is higher than the second refractive index. In some embodiments, the first refractive index is at least 2, while the second refractive index is no greater than 1.8. In the embodiment of FIG. 2, the first reflector layer comprises TiO$_2$ (refractive index of about 2.6), and the second reflector layer comprises SiO$_2$ (refractive index of about 1.5).

The first reflector layer (H) has a first thickness ($t_H$), and the second reflector layer (L) has a second thickness ($t_L$). The thickness of each reflector layer is a thickness measured in a direction normal to a major surface of the respective reflector layer.

In order to tailor the reflectance characteristics of the pump light reflector laminate 61 to reflect the pump light, each of the first and second reflector layers has a thickness refractive index product in the direction normal to the convex surface of the lens of one quarter of the first wavelength (i.e. the central wavelength of the stop-band). That is to say, for the first reflector layer (H), a product of a first thickness ($t_H$) and $n_H$ is equal to $\lambda_0/4$. Similarly, for the second reflector layer (L) a product of a second thickness of the second reflector layer ($t_L$) and $n_L$ is equal to $\lambda_0/4$.

In general, the H layers have a thickness between 5 nm and 50 nm. The L layers of have a thickness between 10 nm and 100 nm.

A plurality of first reflector layers (H) and a plurality of second reflector layers (L) are stacked on top of each other in an alternating manner in order to form a central part of the pump light reflector laminate. The central part of the pump light reflector laminate 61 may be formed from at least 3 layers, with the second reflector layer (L) forming the outer layers of the central part (i.e. a LHL arrangement). In some embodiments at least 5 alternating layers may be provided (LHLHL). In the embodiment shown in FIG. 7, the central part comprises 17 alternating layers (LHL . . . LHL).

On opposite sides of the central part of the pump light reflector laminate 61, 62, first and second interface layers are provided. Each of the first and second interface layers may comprise the same material as the first reflector laminate (i.e. the first and second interface layers have the same refractive index as the first refractive index). The first and second interface layers may have respective third and fourth refractive indexes ($n_3$, $n_4$) and respective third and fourth thicknesses ($t_3$, $t_4$). The first and second interface layers may have a thickness refractive index product equal to one eighth of the pump light wavelength (e.g. $n_3 t_3 = \lambda_0/8$).

Where the layers of the pump light reflector laminate 61, 62 (i.e. the first and second reflector layers and the first and second interface layers) have a refractive index which is dependent on the wavelength of light, the refractive index of the layer for the purpose of this disclosure is considered to be the refractive index of the layer at the central wavelength ($\lambda_0$) of the pump light reflector laminate 61, 62.

The reflectance of a pump light reflector laminate 61 according to an embodiment is shown in FIG. 7. The pump light reflector laminate comprises 17 alternating layers of SiO$_2$ and TiO$_2$, and two interface layers of TiO$_2$ in accordance with the above description (19 total layers). The layers of the pump light reflector laminate 61 have thicknesses configured to reflect pump light having a wavelength of 455 nm. The central wavelength $\lambda_0$ of the pump light reflector laminate is 420 nm. FIG. 7 shows the reflectance of the pump light reflector laminate at three different angles of incidence. For reference, FIG. 7 also shows the spectrum of a pump light LED having a wavelength of 455 nm.

Figure 1A:
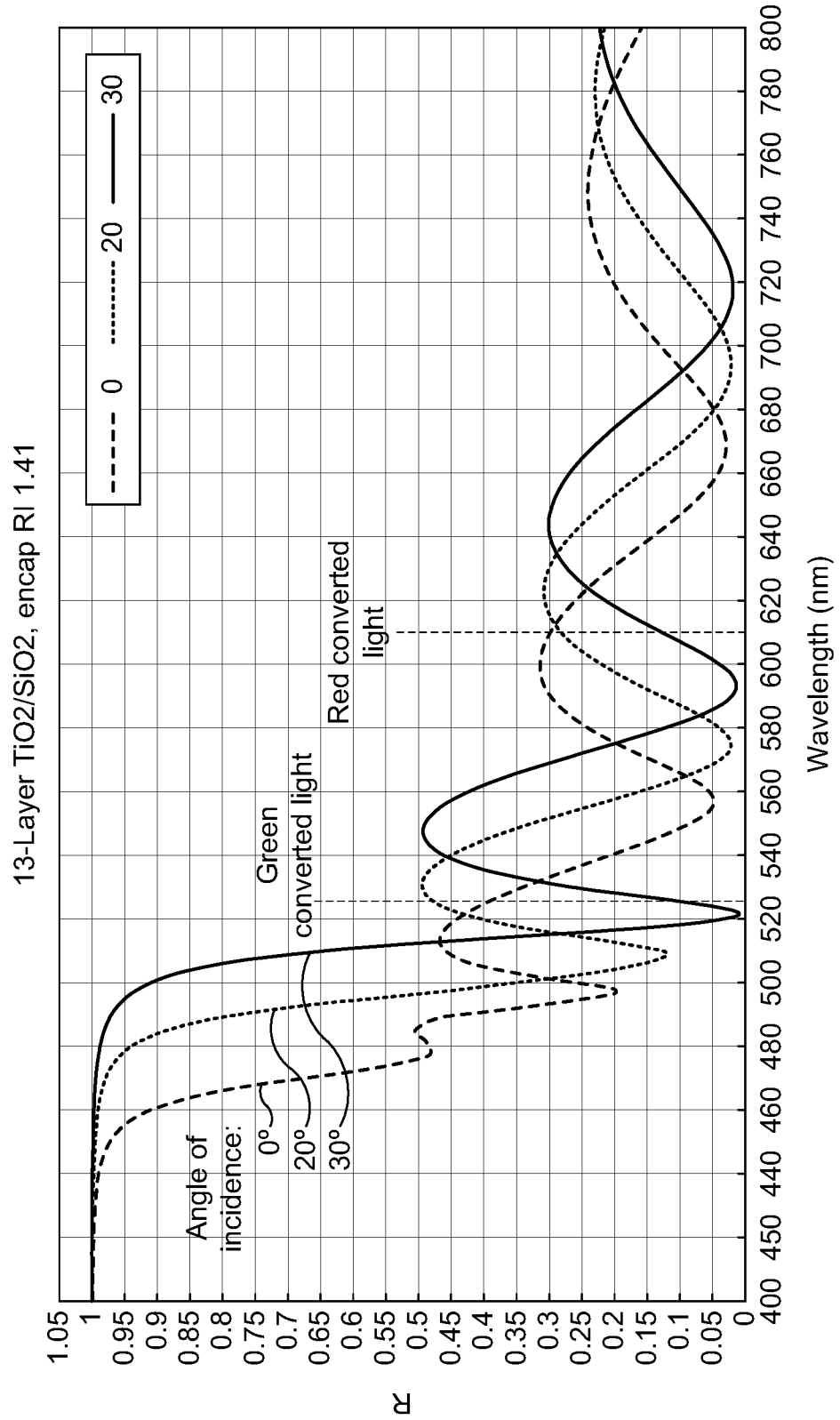
FIG. 1a is a graph of the reflectivity of a Distributed Bragg Reflector for a range of different of angles of incidence.
Figure 1B:
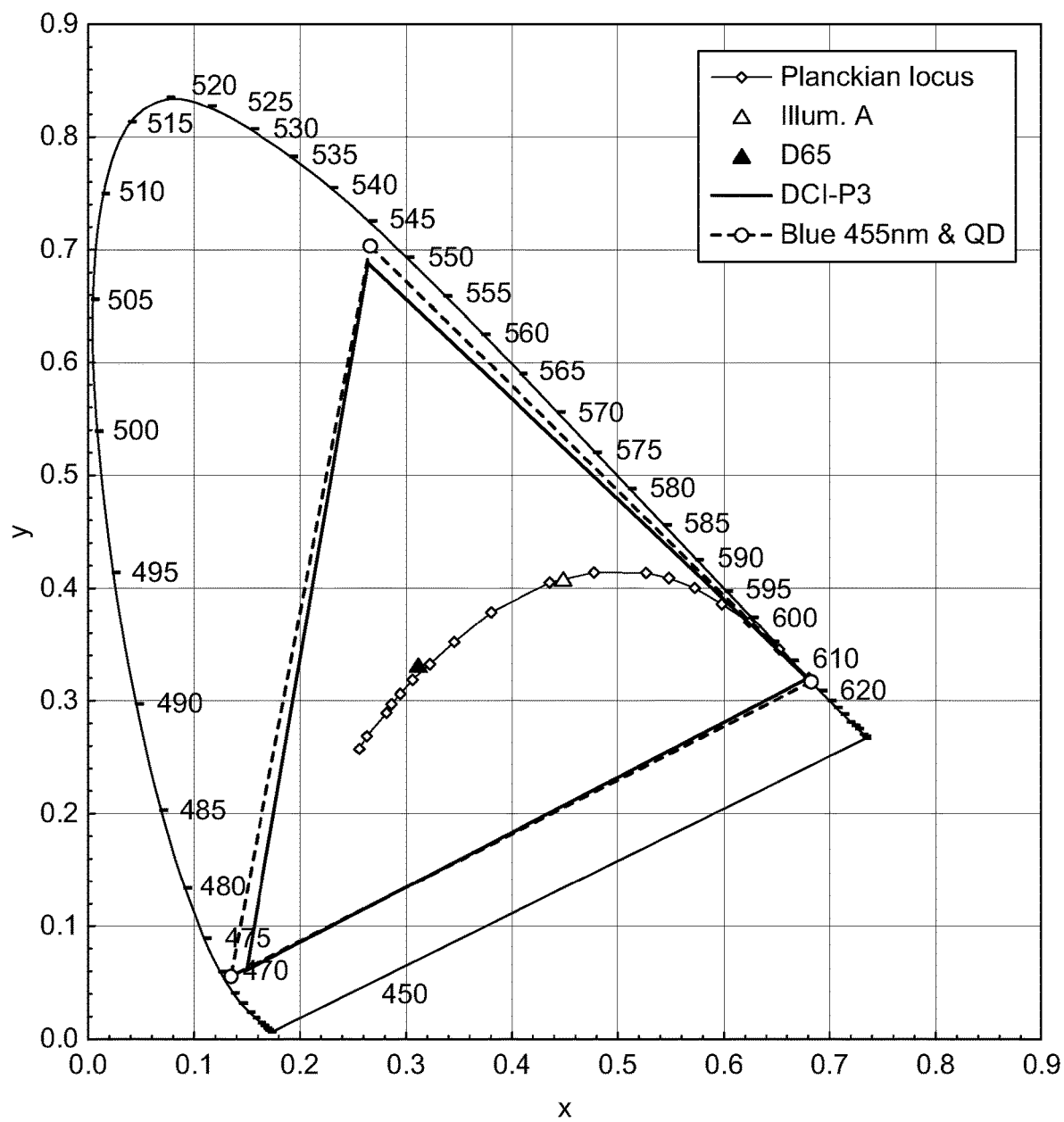
FIG. 1b is a DCI-P3 standard RGB colour space diagram.

By contrast to the reflectance of the DBR shown in FIG. 1a, in FIG. 7 it can be seen that in the upper pass band of the pump light reflector laminate 61 the reflectance is lower than for the DBR. In particular, the reflectance of the pump light reflector laminate 61 in the green through red visible light spectrum is below 5% for angles of incidence between 0° and 30°. Accordingly, the pump light reflector laminate will not reflect as much converted light as the DBR of FIG. 1a, regardless of the angle of incidence. Accordingly, the green and red LEDs 100, 200 incorporating pump light reflector laminates 61, 62 will more efficiently extract converted light compared to a DBR as shown in FIG. 1a.

A diagram of a pump light reflector laminate 61 is shown in FIG. 8. The thickness of each layer of the pump light reflector laminate 61 is expressed in terms of the central wavelength and the refractive index of the respective layer of the pump light reflector laminate. For the pump light reflector laminate of FIG. 7, Table 1 shows the thickness value of each layer. The pump light reflector laminate of Table and FIG. 7 comprises 19 layers. As shown in Table 1, the pump light reflector laminate comprises alternating layers of TiO$_2$ and SiO$_2$.

The first reflector layers and the first and second interface layers each comprise TiO$_2$ having a refractive index of about 2.60 at a wavelength of 420 nm (i.e. $n_H = n_3 = n_4 = 2.60$). The second reflector layers comprise SiO$_2$ having a refractive index of about 1.48 at a wavelength of 420 nm (i.e. $n_L = 1.48$).

TABLE 1

| Layer | Material | Thickness (nm) |
| --- | --- | --- |
| 1 | TiO2 | 20.4 |
| 2 | SiO2 | 71.8 |
| 3 | TiO2 | 40.9 |
| 4 | SiO2 | 71.8 |
| 5 | TiO2 | 40.9 |
| 6 | SiO2 | 71.8 |
| 7 | TiO2 | 40.9 |
| 8 | SiO2 | 71.8 |
| 9 | TiO2 | 40.9 |
| 10 | SiO2 | 71.8 |
| 11 | TiO2 | 40.9 |
| 12 | SiO2 | 71.8 |
| 13 | TiO2 | 40.9 |
| 14 | SiO2 | 71.8 |
| 15 | TiO2 | 40.9 |
| 16 | SiO2 | 71.8 |
| 17 | TiO2 | 40.9 |
| 18 | SiO2 | 71.8 |
| 19 | TiO2 | 20.4 |

The pump light reflector laminate 61 is configured to have a central wavelength of about 420 nm, and an upper stop-band wavelength of about 522 nm. Thus, as shown in FIG. 7, the pump light reflector laminate of FIG. 7 will reflect pump light having a wavelength of 455 nm. In some embodiments, the central wavelength of the pump light reflector laminate is shorter than the pump light wavelength.

The pump light reflector laminate may have an upper stop-band wavelength λe which is determined by the refractive indexes of the pump light reflector laminate. For example, for the pump light reflector laminate of FIG. 7, where $n_3 = n_4 = n_H$, the upper stop-band wavelength may be determined by the equation:

$$\lambda_e = \frac{\lambda_0}{1 - \frac{2}{\pi} \sin^{-1}\left(\frac{(n_H - n_L)}{(n_H + n_L)}\right)} \quad (1)$$

Figure 9:
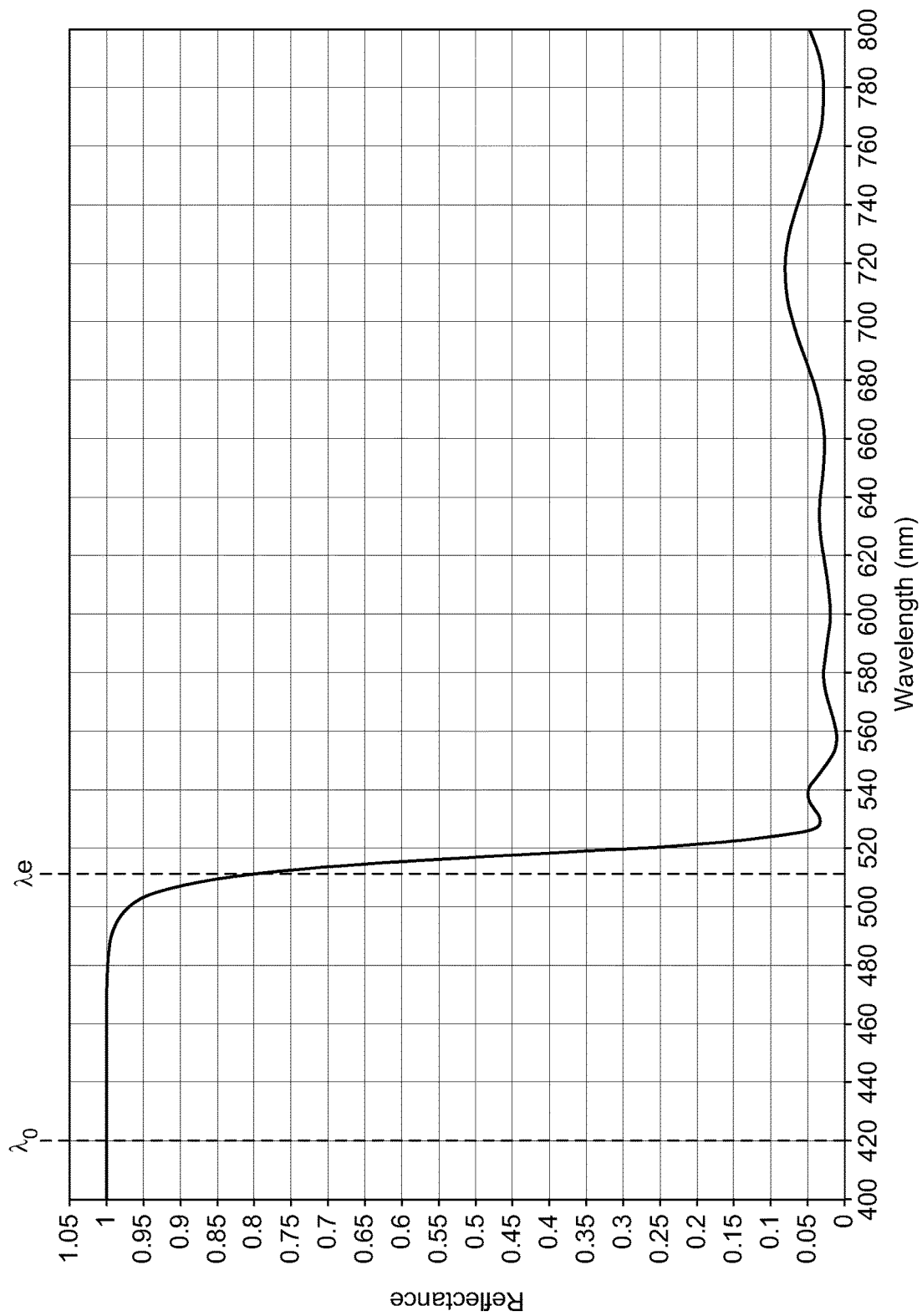
FIG. 9 is a graph of the reflectivity of a reflector laminate showing the central stop-band wavelength and the upper stop-band wavelength

FIG. 9 shows the reflectance for the pump light reflector laminate of FIG. 7 with the central wavelength $\lambda_0$ and the upper stop-band $\lambda e$ indicated. The upper stop-band is calculated as the wavelength at which the reflectance is reduced by 95%. For example, according to equation 1, with $n_H$=2.60 and $n_L$=1.48, and $\lambda_0$=420 nm, it follows that $\lambda_e$=510 nm.

In some embodiments, the LED array 10 may also incorporate a converted light reflector laminate 71, 72. The converted light reflector laminate 71, 72 may be provided between a pump light LED of the light generating layer 20 and a colour converting layer 41, 42 of a LED 100, 200. A converted light reflector laminate 71, 72 may be provided to increase the proportion of converted light extracted from the container volume by reflecting the converted light towards the pump light reflector laminate. The converted light reflector laminate 71, 72 may also be configured to transmit pump light generated in the light emitting layer, so as to not reduce the overall efficiency of the LED by reflecting pump light away from the container volume. As such, the converted light reflector laminate 71, 72 may also be a form of band-stop filter configured to transmit pump light and reflect converted light. As such, the converted light reflector laminate has a stop-band configured to reflect the converted light centred on a second wavelength. In some embodiments, the second wavelength may be equal to the converted light wavelength, but in other embodiments, the converted light reflector laminate may be configured such that, for example, the converted light wavelength falls between the second wavelength and a lower stop-band wavelength.

The converted light reflector laminates 71, 72 may comprise a third interface layer, a plurality of alternating third and fourth reflector layers and a fourth interface layer.

The third interface layer may have a fifth refractive index ($n_5$) and a fifth thickness ($t_5$).

The plurality of alternating third and fourth reflector layers form a central portion of the converted light reflector laminate. The third reflector layer (H) has a sixth refractive index $n_6$ and the fourth reflector layer (L) has a seventh refractive index $n_7$. The third reflector layer (H) has a sixth thickness $t_6$ and the fourth reflector layer (L) has a seventh thickness $t_7$. The fifth and seventh refractive indexes are lower than the sixth refractive index. In some embodiments, the sixth refractive index is at least 2, while the fifth and seventh refractive indexes are no greater than 1.8. In the embodiment of FIG. 7, the third reflector layer (H) comprises $TiO_2$ (refractive index of about 2.60 at 420 nm), and the fourth reflector layer (L) comprises $SiO_2$ (refractive index of about 1.48 at 420 nm).

In order to tailor the reflectance characteristics of the converted light reflector laminate to reflect the converted light, each of the third and fourth reflector layers has a thickness refractive index product in the direction normal to the light emitting surface 24, such that a stop-band of the converted light reflector laminate is configured to reflect the converted light. For example, in some embodiments, the thickness refractive index product may be chosen to be equal to one quarter of the converted light wavelength of the respective converted light layer. For example, in an embodiment in which the converted light layer 41 is configured to convert pump light to converted light having a wavelength of 610 nm, each of the third reflector layers may have a thickness of about 58 nm and each of the fourth reflector layers may have a thickness of 101 nm.

Where the layers of the converted light reflector laminate 71, 72 (i.e. the third and fourth reflector layers and the third and fourth interface layers) have a refractive index which is dependent on the wavelength of light, the refractive index of the layer for the purpose of this disclosure is considered to be the refractive index of the layer at the second wavelength (central wavelength) of the converted light reflector laminate 71, 72.

A plurality of fourth reflector layers (L) and a plurality of third reflector layers (H) are stacked on top of each other in an alternating manner in order to form a central part of the converted light reflector laminate. The central part of the converted light reflector laminate may be formed from at least 3 layers, with the third reflector layer (H) forming the outer layers of the central part (i.e. a HLH arrangement). In some embodiments at least 5 alternating layers may be provided (HLHLH). In the embodiment shown in FIG. 7, central part comprises 19 alternating layers (HLH . . . HLH).

On opposite sides of the central part of the converted light reflector laminate, third and fourth interface layers are provided. Each of the third and fourth interface layers may comprise the same material as the third reflector laminate (i.e. the third and fourth interface layers may have the same refractive index as the third refractive index). The third and fourth interface layers may have a thickness refractive index product equal to one eighth of the central wavelength.

In some embodiments, a converted light reflector laminate may be provided for LEDs only incorporating a colour converting layer 41, 42. Alternatively, the converted light reflector laminate may be provided across substantially all of the light emitting surface 24 of to cover each of the pump light LEDs 21, 22, 23 of the light generating layer. By providing the converted light reflector laminate across the light emitting surface, it may be possible to form the converted light reflector laminate with reduced patterning steps, thereby making the LED array more efficient to fabricate.

In some embodiments, an antireflection layer may be provided over the pump light reflector laminate 61, 62. The antireflection layer is configured to reduce reflection of the converted light at the interface between the second interface layer of the pump light reflector laminate and the external surroundings of the LED array 10 (typically air). In some embodiments, the antireflection layer comprises a material having a refractive index less than a refractive index of the second interface layer of the pump light reflector laminate. For example, the antireflection layer may comprise a material having a refractive index of less than 1.6. For example the antireflection layer may comprise $SiO_2$. In some embodiments, the antireflection layer has a thickness of one quarter of the converted light wavelength. As such, the thickness of the antireflection layer may be configured to reduce reflection of the converted light transmitted by the pump light reflector laminate. Accordingly, the antireflection layer may be provided in order to further increase the converted light extraction efficiency of the LED.

Figure 10:
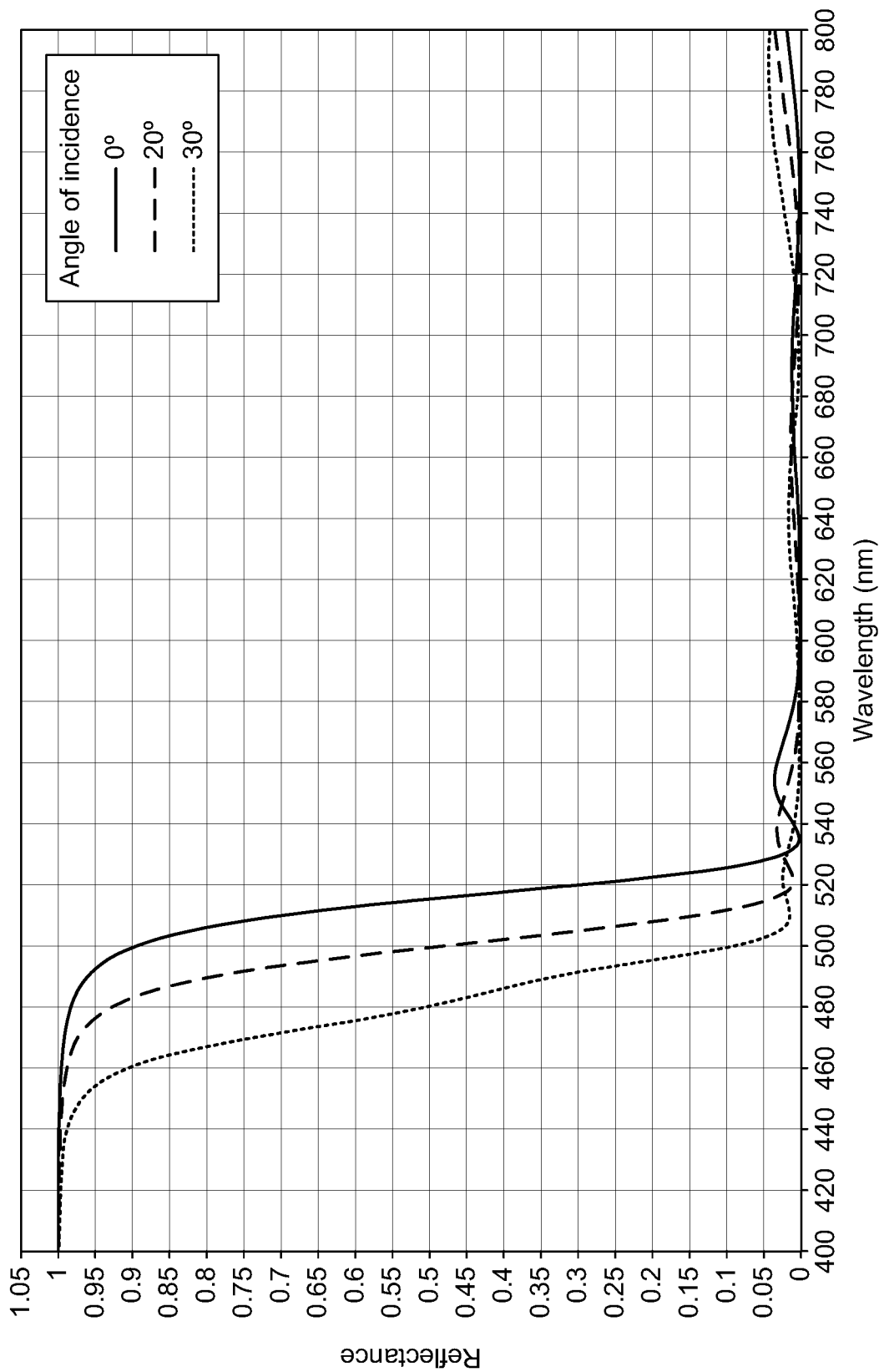
FIG. 10 is a graph of the reflectivity of a reflector laminate including an antireflection layer.

FIG. 10 shows a graph of the reflectance of the pump light reflector laminate incorporating an antireflection layer as described above. In the example of FIG. 10, the design was optimised to reduce reflection for wavelengths between 525 nm to 730 nm.

Figure 11:
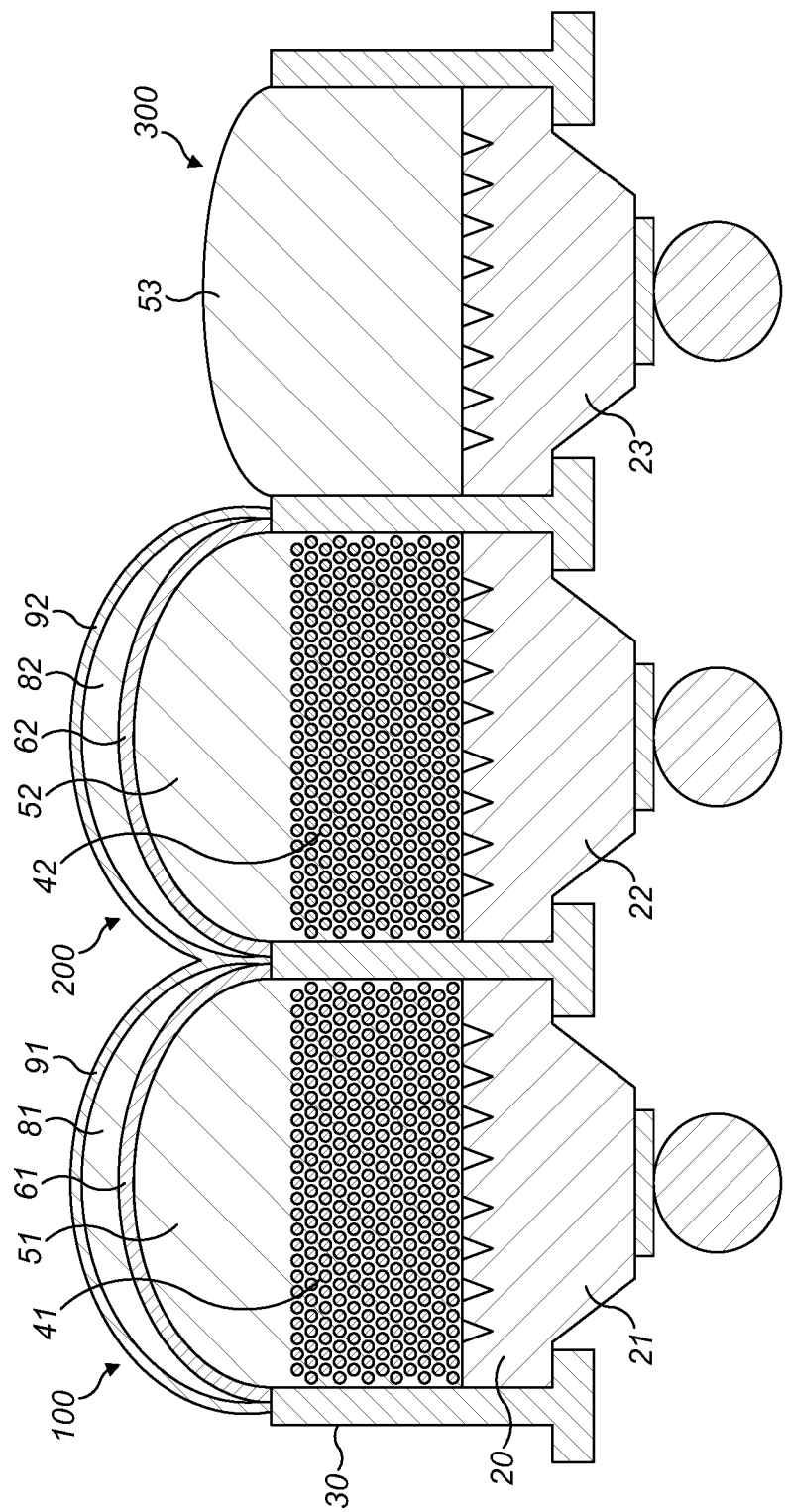
FIG. 11 is a diagram of a LED array according to a further embodiment of this disclosure.

FIG. 11 shows a further embodiment of a LED array 10 according to this disclosure. The light emitting layer, container layer, and colour converting layers are substantially the same as the respective in the embodiment of FIG. 2. In the embodiment of FIG. 11, a pump light reflector laminate 61, 62 is provided between a lens 51, 52 and a lens interface layer 81, 82. Thus, similar to the embodiment of FIG. 2, the pump light reflector laminate 61, 62 is provided on a convex surface of the lens 51, 52. The lens interface layer 81, 82 may have a further convex surface 83, 84 on an opposite side to the pump light reflector layer 61, 62 i.e. the lens interface layer may define a further lens shape over the lens 51, 52 and pump light reflector 61, 62. The lens interface layer 81, 82 may be considered in combination with the lens as a lens super-structure. As such, the pump light reflector laminate 61, 62 may be considered to be provided within a lens super structure. In some embodiments, the antireflection layer 91, 92 may be provided over the pump light reflector layer 61, 62 on the further convex surface of the lens interface layer 81, 82.

Next, a method for forming the LED array 10 will be described.

Firstly, a light emitting layer 20 may be fabricated. The light emitting layer 20 may be fabricated using any known process for fabricating Group III-nitride electronic devices. For example, the light emitting layer 20 may be fabricated using one or more of Metal Organic Chemical Vapour Deposition (MOCVD), Molecular Beam Epitaxy (MBE). Further discussion of suitable processes for forming a light generating layer may be found in at least GB 181109.6.

Next, a converted light reflector laminate 71, 72, 73 may be formed on the light emitting surface 24 of the light generating layer 20. The converted light reflector laminate may be provided across substantially all of the light emitting surface such that the light emitting surface 24 covers all of the pump light LEDs 21, 22, 23. The converted light reflector laminate 71, 72, 73 may be formed from alternating layers of $SiO_2$ and $TiO_2$. The layers of the converted light reflector laminate 71, 72, 73 may be deposited by a Chemical Vapour Deposition process, for example E-beam evaporation or low temperature sputtering, or any other known method in the art.

The container layer 30 may then be formed by thin film deposition of continuous layer of the container layer 30. The continuous layer may then be patterned using a suitable mask and etched to remove portions of the continuous layer in order to define the container volumes 31, 32, 33. Alternatively, the container layer may be formed by depositing a mask layer over the light emitting surface 24 (or the converted light reflector laminate 71, 72, 73 if present), the mask layer configured to selectively mask portions on the light emitting layer corresponding to the container volumes 31, 32, 33. The container layer 30 may then be deposited on the exposed portions of the light generating layer 20 (or the converted light reflector laminate 71, 72, 73).

The container volumes 31, 32 may be selectively filled with one or more colour converting layers 41, 42.

Subsequently, a lens 51, 52, 53 may be formed over the container volumes 31, 32, 33. The lens may comprise $SiO_2$, which is deposited using a CVD process. The convex surface of the lens 51, 52, 53 may be formed by any of the processes as described above.

Next, a pump light reflector laminate 61, 62 may be formed on the convex surface of the lenses 51, 52 which cover filled container volumes 31, 32. The pump light reflector laminate 51, 52. In some embodiments, the pump light reflector laminate may be formed across substantially all of the lenses 51, 52, 53, followed by a process in which the pump light reflector laminate is selectively removed (e.g. by etching) from LEDs which are not required to filter pump light (e.g. LEDs with unfilled container volumes 33). The pump light reflector laminate 51, 52 may be formed from alternating layers of $SiO_2$ and $TiO_2$. The layers of the pump light reflector laminate 61, 62 may be deposited by a Chemical Vapour Deposition process, for example MOCVD, or any other known method in the art.

An antireflection layer may be formed over the pump light reflector laminate 61, 62. The antireflection layer may comprise dielectric such as $SiO_2$, or $MgF_2$ or $ZrO_2$. Accordingly, the antireflection layer may be formed over the pump light reflector laminate using similar processes used to form the pump light reflector laminate 61, 62.

In some embodiments, a lens interface layer 81, 82 may be formed over the pump light reflector laminate 61, 62. The lens interface layer 81, 82 may be formed using similar processes used to form the lens 51, 52.

According to the above disclosure a LED array 10 may be provided. It will be appreciated that the above disclosure also provides a LED incorporating a colour converting layer.

Thus, according to embodiments of this disclosure, a LED or LED array is provided which has increased converted light extraction efficiency, whilst also reducing pump light leakage.

The invention claimed is:

1. A light emitting diode comprising:
   a LED layer configured to emit pump light having a pump light wavelength from a light emitting surface, the LED layer comprising a plurality of Group III-nitride layers;
   a container layer provided on the light emitting surface of the LED layer, the container layer having a container surface on an opposite side of the container layer to the light emitting surface, the container surface including an opening defining a container volume through the container layer to the light emitting surface of the LED layer;
   a colour converting layer provided in the container volume, the colour converting layer configured to absorb pump light and emit converted light of a converted light wavelength longer than the pump light wavelength; and
   a lens provided on the container surface over the opening, the lens having a convex surface on an opposite side of the lens to the colour converting layer;
   a pump light reflector laminate provided over the convex surface of the lens, the pump light reflector laminate having a stop-band configured to reflect the pump light centred on a first wavelength comprising:
      a first interface layer provided on the convex surface of the lens; the first interface layer having a first thickness and a first refractive index, wherein a product of the first refractive index and first thickness is one eighth of the first wavelength;
      a plurality of layers alternating between:
         a low reflectance layer having a second refractive index and a second thickness, wherein the second refractive index is lower than the first refractive index; and
         a high reflectance layer having a third thickness and a third refractive index which is higher than the second refractive index,
         wherein a product of the second refractive index and the second thickness for each of the low reflectance layers is one quarter of the first wavelength, and a product of the third refractive index and the third thickness for each of the high reflectance layers is one quarter of the first wavelength;
      a second interface layer provided on a low reflectance layer of the plurality of layers, the second interface layer having a fourth refractive index and a fourth thickness,
      wherein a product of the fourth refractive index and the fourth thickness is one eighth of the first wavelength, and the fourth refractive index is larger than the second refractive index, wherein the opening at the container surface has a first characteristic diameter (Do) and the lens has a second characteristic diameter ($D_1$) on the container surface, wherein the first and second characteristic diameters satisfy the relationship: $0.1\ D_1 \le D_0 \le 0.8\ D_1$.

2. A light emitting diode according to claim 1, wherein the container layer comprises an inner sidewall defining the container volume, wherein the inner sidewall defining the container volume is sloped at an acute angle relative to the light emitting surface of the LED layer and comprises a reflective material.

3. A light emitting diode according to claim 1, further comprising a converted light reflector laminate provided between the LED layer and the colour converting layer, the converted light reflector laminate having a stop-band configured to reflect the converted light centred on a second wavelength comprising:
 a third interface layer provided on the light emitting surface of the LED layer; the third interface layer having a fifth thickness and a fifth refractive index, wherein a product of the fifth thickness and fifth refractive index is one eighth of the second wavelength;
 a plurality of layers alternating between:
  a converted light high reflectance layer having a sixth thickness and a sixth refractive index which is higher than the fifth refractive index,
  a converted light low reflectance layer having a seventh refractive index and a seventh thickness, wherein the seventh refractive index is lower than the sixth refractive index; and
  wherein a product of the sixth refractive index and the sixth thickness for each of the converted light high reflectance layers is one quarter of the second wavelength, and a product of the seventh refractive index and the seventh thickness for each of the converted light low reflectance layers is one quarter of the second wavelength;
 a fourth interface layer provided on a converted light high reflectance layer of the plurality of layers, the fourth interface layer having an eighth refractive index and an eighth thickness, wherein a product of the eighth refractive index and the eighth thickness is one eighth of the second wavelength, and the eighth refractive index is lower than the sixth refractive index.

4. A LED according to claim 3, wherein the first refractive index of the first interface layer, the third refractive index of the high reflectance layer, and the fourth refractive index of the second interface layer are the same; and/or
 the fifth refractive index of the third interface layer, the seventh refractive index of the converted light low reflectance layer, and the eighth refractive index of the fourth interface layer are the same.

5. A LED according to claim 1, further comprising a reflection enhancement layer provided on the inner sidewall of the container layer, the reflection enhancement layer comprising a dielectric.

6. A LED according to claim 1, further comprising an antireflection layer provided over the pump light reflector laminate, the antireflection layer configured to reduce reflection of light of the converted light wavelength.

7. A LED according to claim 1, wherein a lens interface layer is provided on the pump light reflector laminate on an opposite side to the lens.

8. A LED according to claim 1, wherein the colour converting layer comprises quantum dots or a phosphor.

9. A LED according to claim 1, wherein the inner sidewall forms an angle relative to the light emitting surface of the LED layer of at least 45°; and/or
 the inner sidewall forms an angle relative to the light emitting surface of the LED layer of no greater than 85°.

10. A LED according to claim 1, wherein the pump light wavelength may be at least 440 nm and/or no greater than 480 nm; and/or
 the converted light wavelength may be at least 500 nm and/or no greater than 650 nm.

11. A LED according to claim 1, wherein the first, third and/or fourth refractive index is at least 2; and/or
 wherein the second refractive index is no greater than 1.8.

12. A LED according to claim 1, wherein the container layer defines an opening having a surface area of no greater than $10^{-8}$ m².

13. A LED according to claim 1, wherein the first wavelength (20), the second refractive index ($n_L$) and the third refractive index ($n_H$) of the pump light reflector laminate provide an upper stop-band wavelength (e) of the pump light reflector laminate which is longer than the pump light wavelength, where:

$$\lambda_e = \frac{\lambda_0}{1 - \frac{2}{\pi}\sin^{-1}\left(\frac{(n_H - n_L)}{(n_H + n_L)}\right)}$$

14. A LED according to claim 1, wherein the pump light reflector and/or the converted light reflector comprises layers of $TiO_2$ and $SiO_2$.

15. A light emitting diode array comprising:
 a LED layer comprising a plurality of LEDs, each LED configured to emit pump light of a pump light wavelength from a light emitting surface and each LED comprising a plurality of Group III-nitride layers;
 a container layer provided on the light emitting surface of the LED layer, the container layer having a container surface on an opposite side of the container layer to the light emitting surface, the container surface including a plurality of openings each defining a container volume through the container layer to the light emitting surface of the LED layer, each opening and container volume aligned with a respective LED of the LED layer,
 a colour converting layer selectively provided in a container volume, the colour converting layer configured to absorb pump light and emit first converted light of a first converted light wavelength longer than the pump light wavelength;
 a lens provided on the container surface over the opening to the container volume containing a colour converting material, the lens having a convex surface on an opposite side of the lens to the colour converting layer;
 a pump light reflector laminate provided over the convex surface of the lens, the pump light reflector laminate having a stop-band configured to reflect the pump light centred on a first wavelength comprising:
  a first interface layer provided on the convex surface of the lens; the first interface layer having a first thickness and a first refractive index, wherein a product of the first refractive index and first thickness is one eighth of the first wavelength;

a plurality of layers alternating between:
  a low reflectance layer having a second refractive index and a second thickness, wherein the second refractive index is lower than the first refractive index; and
  a high reflectance layer having a third thickness and a third refractive index which is higher than the second refractive index, wherein a product of the second refractive index and the second thickness for each of the low reflectance layers is one quarter of the first wavelength, and a product of the third refractive index and the third thickness for each of the high reflectance layers is one quarter of the first wavelength; a second interface layer provided on a low reflectance layer of the plurality of layers, the second interface layer having a fourth refractive index and a fourth thickness, wherein a product of the fourth refractive index and the fourth thickness is one eighth of the first wavelength, and the fourth refractive index is larger than the second refractive index,
wherein each opening at the container surface has a first characteristic diameter ($D_0$) and each lens has a second characteristic diameter ($D_1$) on the container surface, wherein the first and characteristic diameters satisfy the relationship: $0.1\ D_1 < D_0 < 0.8\ D_1$.

16. A light emitting diode array according to claim 15, wherein
a further colour converting layer is provided in a further container volume of the plurality of container volumes, the further colour converting layer configured to absorb pump light and emit second converted light of a second converted light wavelength longer than the first converted light wavelength, a lens is provided over the further container volume, and a pump light reflector laminate is provided on the lens.

17. A light emitting diode array according to claim 15, further comprising:
at least one converted light reflector laminate provided between the colour converting layer and the light emitting surface of the corresponding LED of the LED layer, the converted light reflector laminate the converted light reflector laminate having a stop-band configured to reflect the first and/or second converted light centred on a second wavelength comprising:
  a third interface layer provided on the light emitting surface of the LED layer; the third interface layer having a fifth thickness and a fifth refractive index, wherein a product of the fifth thickness and fifth refractive index is one eighth of the second wavelength;
  a plurality of layers alternating between:
    a converted light high reflectance layer having a sixth thickness and a sixth refractive index which is higher than the fifth refractive index,
    a converted light low reflectance layer having a seventh refractive index and a seventh thickness, wherein the seventh refractive index is lower than the sixth refractive index; and
  wherein a product of the sixth refractive index and the sixth thickness for each of the converted light high reflectance layers is one quarter of the second wavelength, and a product of the seventh refractive index and the seventh thickness for each of the converted light low reflectance layers is one quarter of the second wavelength; a fourth interface layer provided on a converted light high reflectance layer of the plurality of layers, the fourth interface layer having an eighth refractive index and an eighth thickness, wherein a product of the eighth refractive index and the eighth thickness is one eighth of the second wavelength, and the eighth refractive index is lower than the sixth refractive index.

18. A LED array according to claim 15, wherein the container layer comprises a plurality of inner sidewalls defining the container volumes, wherein the inner sidewalls defining the container volumes are sloped at an acute angle relative to the light emitting surface of the LED layer and comprise a reflective material.

19. A LED array according to claim 18, further comprising a reflection enhancement layer provided on the inner sidewalls of the container layer, the reflection enhancement layer comprising a dielectric.

20. A LED array according to any of claim 15, further comprising an antireflection layer provided over each pump light reflector laminate, the antireflection layer configured to reduce reflection of light of the first converted light wavelength and/or the second converted light wavelength.

21. A LED array according to claim 15, wherein each colour converting layer comprises a quantum dots or a phosphor.

22. A LED array according to claim 15, wherein the inner sidewalls form an angle relative to the light emitting surface of the LED layer of at least 30°; and/or
the inner sidewalls form an angle relative to the light emitting surface of the LED layer of no greater than 85°.

23. A LED array according to claim 15, wherein the pump light wavelength may be at least 440 nm and/or no greater than 480 nm; and/or
the first converted light wavelength may be at least 500 nm and/or no greater than 650 nm; and/or
the second converted light wavelength may be at least 600 nm and/or no greater than 650 nm.

24. A LED array according to claim 15, wherein the pump light reflector laminate comprises layers of $SiO_2$ and $TiO_2$.

25. A LED array according to claim 15, wherein the pump light reflector laminate comprises a plurality of layers comprising oxygen, and a plurality of layers comprising fluorine.

* * * * *